US012805293B2

(12) United States Patent
Xie et al.

(10) Patent No.: US 12,805,293 B2
(45) Date of Patent: Nov. 17, 2026

(54) TRENCH ISOLATION STRUCTURES FOR BACKSIDE CONTACTS

(71) Applicant: International Business Machines Corporation, Armonk, NY (US)

(72) Inventors: Ruilong Xie, Niskayuna, NY (US); Kisik Choi, Watervliet, NY (US); Cung Tran, Niskayuna, NY (US); Domingo Ferrer, Clifton Park, NY (US); Kevin W. Brew, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 538 days.

(21) Appl. No.: 18/213,523

(22) Filed: Jun. 23, 2023

(65) Prior Publication Data

US 2024/0429166 A1 Dec. 26, 2024

(51) Int. Cl.

| | |
|---|---|
| ***H10W 20/41*** | (2026.01) |
| ***H10D 64/23*** | (2025.01) |
| ***H10D 84/85*** | (2025.01) |

(52) U.S. Cl.

CPC ........ *H10W 20/427* (2026.01); *H10D 64/256* (2025.01); *H10D 84/85* (2025.01)

(58) Field of Classification Search

CPC ............. H10D 84/0193; H10D 84/853; H10D 84/0165–0195; H10D 84/85–859; H10D 84/0151; H10D 84/0153; H10D 84/0188; H10D 62/118; H10D 62/119; H10D 62/121; H10D 62/122; H10D 62/123; H10D 62/115; H10D 62/116; H10D 30/0243; H10D 89/911; H10D 89/611; H10D 74/254; H10D 64/256; H01L 21/76224;

(Continued)

(56) References Cited

U.S. PATENT DOCUMENTS

| | | | |
|---|---|---|---|
| 8,829,562 B2 | 9/2014 | Schulze et al. | |
| 8,916,433 B2 | 12/2014 | Scheiper et al. | |

(Continued)

FOREIGN PATENT DOCUMENTS

KR 101057569 B1 8/2011

OTHER PUBLICATIONS

Chu, W.-C, et al., "Case Study for STI-LDNMOS Burned During HCI Stress to Passing Reliability Specifications", 2022 IEEE International Symposium on the Physical and Failure Analysis of Integrated Circuits (IPFA), Date of Conference: Jul. 18-21, 2022, 4 pages.

*Primary Examiner* — Wael M Fahmy

*Assistant Examiner* — Thomas Wilson McCoy

(74) *Attorney, Agent, or Firm* — Scully, Scott, Murphy & Presser, P.C.; Samuel Waldbaum

(57) ABSTRACT

A semiconductor structure having two different trench isolation structures is provided. The first trench isolation structure is located in a space between each neighboring pair of first conductivity type field effect transistors (FETs) and between each neighboring pair of second conductivity type FETs. The second trench isolation structure is located in a space between each neighboring pair of first conductivity type FETs and second conductivity type FETs. The first and second trench isolations structures are designed to have different widths and contain compositionally different trench dielectric materials.

18 Claims, 36 Drawing Sheets

(58) Field of Classification Search

CPC ......... H01L 21/76229; H01L 21/76232; H01L 21/76898; H01L 21/486; H01L 23/49827; H01L 23/5384; H01L 23/481; H01L 23/5286; H01L 23/60–62; H01L 29/4175; H01L 2225/06541–06544; H01L 2225/06548; H10W 20/427; H10W 60/635; H10W 60/611; H10W 20/20; H10W 20/023; H10W 90/297; H10W 72/823; H10W 20/40; H10W 20/41; H10W 10/014; H10W 10/170143; H10W 10/0145

See application file for complete search history.

(56) References Cited

U.S. PATENT DOCUMENTS

| | | | | |
|---|---|---|---|---|
| 9,646,962 | B1 * | 5/2017 | Liu | H10D 84/0172 |
| 9,780,210 | B1 * | 10/2017 | Goktepeli | H10D 30/637 |
| 10,347,625 | B2 | 7/2019 | Moen et al. | |
| 10,580,857 | B2 | 3/2020 | Wang et al. | |
| 11,521,927 | B2 | 12/2022 | Xie et al. | |
| 2004/0009636 | A1 * | 1/2004 | Ichinose | H10W 10/0143 257/E21.546 |
| 2008/0283930 | A1 * | 11/2008 | Dyer | H10W 10/0143 257/E21.632 |
| 2012/0299080 | A1 * | 11/2012 | Dennard | H10D 86/201 438/154 |
| 2017/0047423 | A1 * | 2/2017 | Schmenn | H10D 84/0102 |
| 2018/0175034 | A1 * | 6/2018 | Goktepeli | H10D 84/853 |
| 2021/0104616 | A1 * | 4/2021 | Su | H10D 64/015 |
| 2021/0111115 | A1 | 4/2021 | Morrow et al. | |
| 2021/0134721 | A1 | 5/2021 | Chiang et al. | |
| 2021/0202385 | A1 | 7/2021 | Huang et al. | |
| 2021/0272903 | A1 | 9/2021 | Doornbos | |
| 2021/0305252 | A1 | 9/2021 | Chiang et al. | |
| 2021/0305381 | A1 | 9/2021 | Chiang et al. | |
| 2021/0351303 | A1 | 11/2021 | Ju et al. | |
| 2021/0376071 | A1 | 12/2021 | Liu et al. | |
| 2021/0376093 | A1 | 12/2021 | Chu et al. | |
| 2022/0310514 | A1 | 9/2022 | Wei | |
| 2022/0344263 | A1 * | 10/2022 | Peng | H10W 20/427 |
| 2023/0037957 | A1 * | 2/2023 | Thomas | H10D 84/856 |
| 2024/0243058 | A1 * | 7/2024 | Mun | H10W 20/497 |

* cited by examiner

TRENCH ISOLATION STRUCTURES FOR BACKSIDE CONTACTS

BACKGROUND

The present application relates to semiconductor technology, and more particularly to a semiconductor structure including different types of trench isolation structures located adjacent to various backside contacts.

When forming a structure including a plurality of complementary metal oxide semiconductor (CMOS) devices, such as integrated circuits, standard cells can be used as a base unit for designing and manufacturing the integrated circuits. The standard cell(s) can be used to form one or more functional circuits, and each standard cell can have the same footprint. Using standard cells when designing complex circuits and components reduces design and manufacture costs.

In use, each standard cell of a semiconductor structure requires power input (VDD) and ground (VSS) connections. To power the various components thereof, each standard cell is generally coupled to a backside power rail which is electrically connected to an active layer of the standard cell to provide the power (VDD). In some instances, a plurality of backside power rails may be provided for each standard cell to respectively provide the power (VDD) and the ground (VSS).

SUMMARY

The present application provides a semiconductor structure having two different trench isolation structures. The first trench isolation structure is located in a space between each neighboring pair of first conductivity type field effect transistors (FETs) and between each neighboring pair of second conductivity type FETs. The second trench isolation structure is located in a space between each neighboring pair of first conductivity type FETs and second conductivity type FETs. The first and second trench isolations structures are designed to have different widths and contain compositionally different trench dielectric materials.

In one aspect of the present application, a semiconductor structure is provided. In one embodiment, the semiconductor structure includes a logic device region including a plurality of first conductivity type FETs and a plurality of second conductivity type FETs. In the structure, the first conductivity type FETs are spaced apart from the second conductivity type FETs and the first conductivity type FETs are of a different conductivity than the second conductivity type FETs. The structure further includes a first trench isolation structure located in a space between each neighboring pair of first conductivity type FETs and between each neighboring pair of second conductivity type FETs. The first trench isolation structure includes a first trench dielectric material as a sole trench dielectric material. The structure even further includes a second trench isolation structure located in a space between each neighboring pair of first conductivity type FETs and second conductivity type FETs. The second trench isolation structure includes at least a second trench dielectric material that is compositionally different from the first trench dielectric material.

DETAILED DESCRIPTION

Figure 1A:
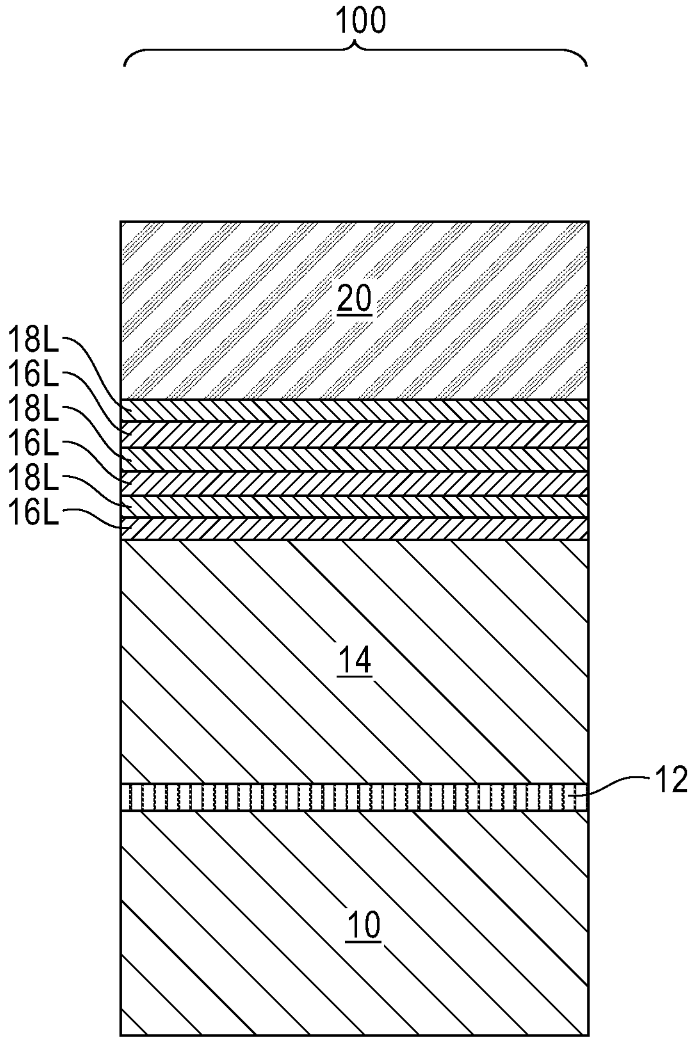
FIG. 1A is a cross gate sectional view of an exemplary semiconductor structure in a logic device region that can be employed in one embodiment of the present application, the exemplary structure includes a material stack of alternating sacrificial semiconductor material layers and semiconductor channel material layers located on a substrate, and a hard mask layer located on the material stack.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In semiconductor structures including backside power rails and backside source/drain contacts, overlap concerns can exist between the backside power rails and the backside source/drain contact structures. This overlap concern is especially prevalent when the spacing between an nFET logic device and a pFET logic device is small. Also, in structures including passive devices and logic devices, there is a large forbidden area that exists between these two device regions. During backside processing of structures including a logic device region and a passive device region, an unwanted undercut may occur in the forbidden area. These concerns are overcome by the structure of the present application.

Figure 18A:
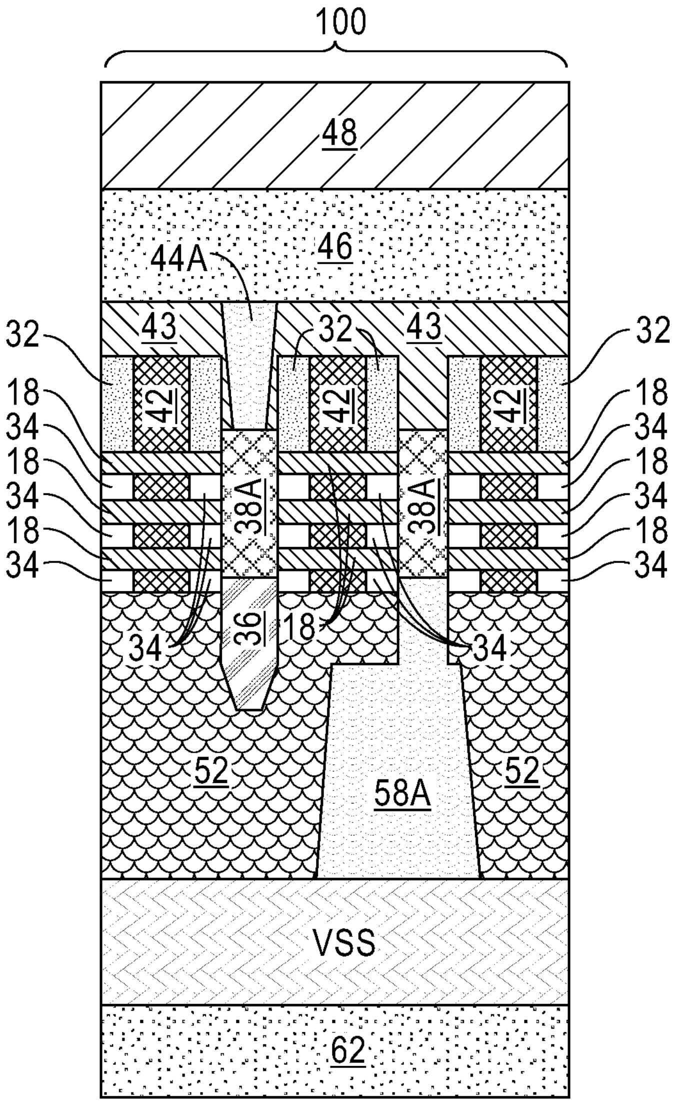
FIGS. 18A and 18B are cross sectional views of the exemplary semiconductor structure shown in FIGS. 17A and 17B, respectively, after forming an initial backside BEOL structure and an additional backside BEOL structure.
Figure 18B:
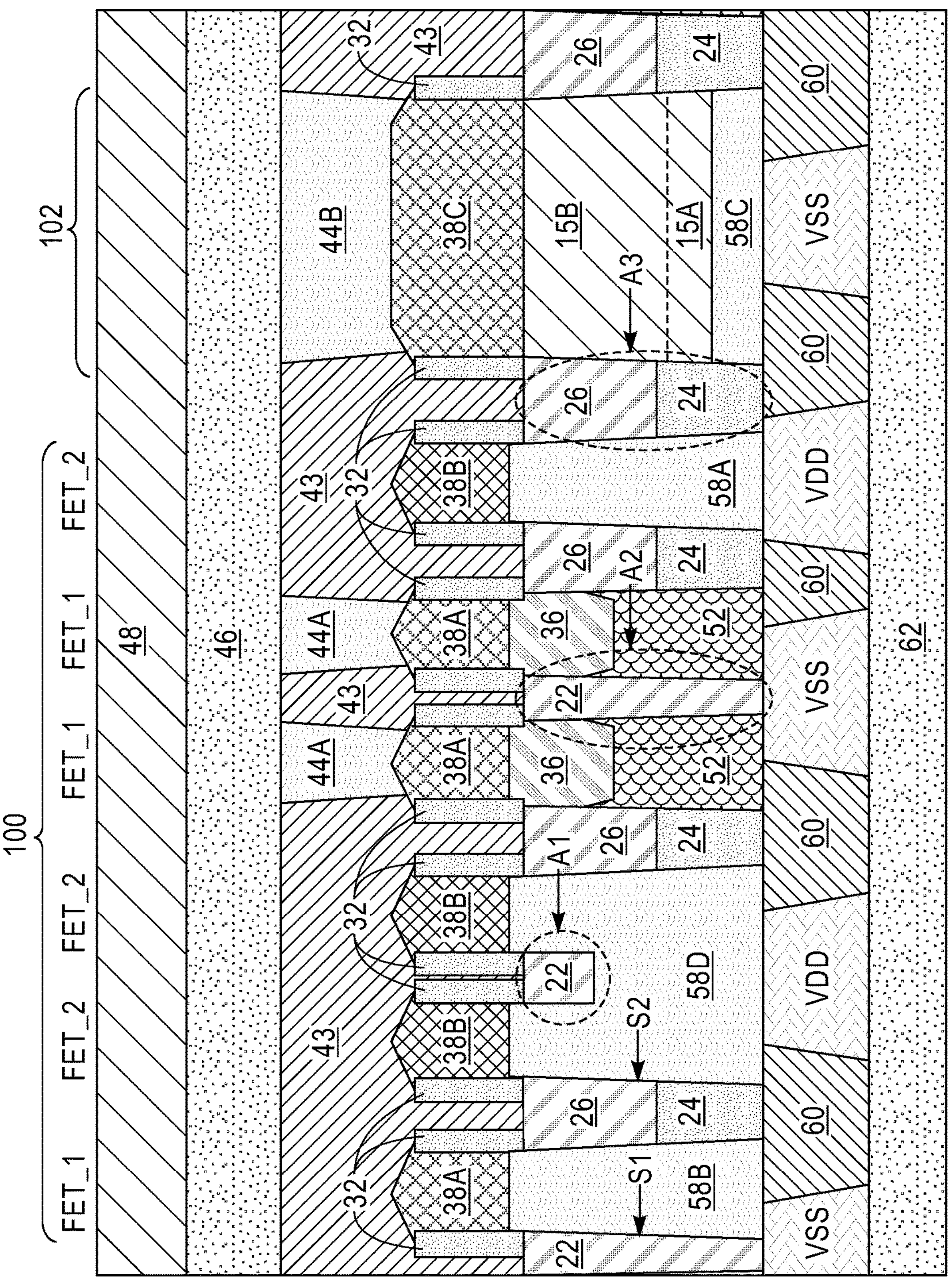

In one aspect of the present application, a semiconductor structure is provided. In one embodiment and as is shown in FIGS. 18A and 18B, the semiconductor structure includes logic device region 100 that includes a plurality of first conductivity type FETs, FET_1, and a plurality of second conductivity type FETs, FET_2. In the structure of the present application, the first conductivity type FETs are spaced apart from the second conductivity type FETs and the first conductivity type FETs are of a different conductivity than the second conductivity type FETs. First trench isolation structure, S1, is located in a space between each neighboring pair of first conductivity type FETs and between each neighboring pair of second conductivity type FETs. First trench isolation structure, S1, includes first trench dielectric material 22 as a sole trench dielectric material. Second trench isolation structure, S2, is located in a space between each neighboring pair of first conductivity type FETs and second conductivity type FETs. Second trench isolation structure, S2, includes at least a second trench dielectric material 24 that is compositionally different from the first trench dielectric material 22. Having different dielectric compositions in the first trench isolation structure, S1, and the second trench isolation structure, S2, enables self-aligned isolation between the backside contacts to the FETs with different polarities (i.e., different conductivity type FETs). It also enables a merged contact for FETs with the same polarity.

In some embodiments, the first conductivity type FETs are pFETs and the second conductivity type FETs are nFETs. In other embodiments, the first conductivity type FETs are nFETs and the second conductivity type FETs are pFETs. In the present application, the first trench isolation structure, S1, is located between each pFET-pFET combination and between each nFET-NFET combination. The second trench isolation structure, S2, is located between each nFET-pFET combination and between the logic device region 100 and the passive device region 102.

In some embodiments, second trench isolation structure, S2, is entirely composed of the second trench dielectric material 24; this enables ease of fabrication. In other embodiments, second trench isolation structure, S2, is a bilayer trench dielectric structure that further includes third trench dielectric material 26 located entirely above the second trench dielectric material 24. Having different dielectric materials within the same trench provides added electrical isolation in the structure. In such embodiments, the third trench dielectric material 26 is compositionally different from the second trench dielectric material 24. In some embodiments, in which the third trench dielectric material 26 is present, the third trench dielectric material 24 is compositionally the same as the first trench dielectric material 22. In yet other embodiments, in which the third trench dielectric material 26 is present, the third trench dielectric material 24 is compositionally different from the first trench dielectric material 22.

In embodiments, first trench isolation structure, S1, has a first width and the second trench isolation structure, S2, has a second width, wherein the first width is greater than the second width. This enables the formation of the two different types of trench isolation structures. Notably, the first width enables formation of the second trench isolation structure, S2, and the second width enables formation of the first trench isolation structure, S1.

In some embodiments and as illustrated in FIG. 18B, the structure further includes a merged backside source/drain contact structure (i.e., backside contact structure 58D) contacting source/drain regions of at least one neighboring pair of first conductivity type FETs or source/drain regions of at least one neighboring pair of second conductivity type FETs. By way of one example, and as is illustrated in FIG. 18B, the merged backside source/drain contact structure (i.e., backside contact structure 58D) contacts source/drain regions 38B of two neighboring second conductivity type FETs, FET_2. The alternative configuration is also possible. This enables a very robust contact between the backside contact structure 58D and the backside power rails (e.g., the VDD power rails).

In some embodiments and as illustrated in FIG. 18B, the structure further includes an additional backside BEOL structure 62 electrically contacted to the merged backside source/drain contact structure (i.e., backside contact structure 58D) via a VDD power rail, VDD, located in an initial backside BEOL structure. This enables robust backside wiring.

In the present application, the first trench isolation structure, S1, that is located in the space between the at least one neighboring pair of first conductivity type FETs or the at least one neighboring pair of second conductivity type FETs including the merged backside source/drain contact structure (see region A1 of FIG. 18B), has a depth that is less than a depth of the second trench isolation structure, S2 (see region A3 of FIG. 18B). This enables the merge contact and still provides sufficient device isolation. Note that the depth of second trench isolation structure, S2, (see region A3 of FIG. 18B) is typically the same as the depth of the first trench isolation structure, S1, in region A2.

In some embodiments and as illustrated in FIG. 18B, the structure further includes frontside contact structure (i.e., frontside contact structure 44A) contacting a source/drain region of the first conductivity type FETs not including the merged backside source/drain contact structure or a source/drain region of the second conductivity type FETs not including the merged backside source/drain contact structure. By way of one example, and as is illustrated in FIG. 18B, the frontside source/drain contact structure 44A contacts the source/drain region of a neighboring pair of first conductivity type FETs, FET_1. The alternative configuration is contemplated. This enables wiring on the frontside of the structure.

In some embodiments and as illustrated in FIG. 18B, the structure further includes frontside BEOL structure 46 contacting the frontside contact structure (i.e., frontside contact structure 44A). This provides additional wiring on the frontside of the structure.

In some embodiments and as illustrated in FIG. 18B, the structure further backside contact placeholder structure 36 located beneath the source/drain region that contacts the frontside contact structure (i.e., frontside contact structure 44A). By way of one example, and as is illustrated in FIG. 18B, backside contact placeholder structure 36 is located beneath source/drain regions 38A of the neighboring pair of first conductivity type FETs, FET_1. The backside contact placeholder structure 36 provides a landing spot for the source/drain region of the FET and isolates the source/drain region from direct backside wiring.

In some embodiments and as illustrated in FIG. 18B, the semiconductor structure further includes a passive device region 102 located adjacent to the logic device region 100. In embodiments including the passive device region 102, the semiconductor structure includes passive device region-logic device region second trench isolation structure, S2 in region A3, located in a space between the logic device region 100 and the passive device region 102. This passive device region-logic device region second trench isolation structure, S2, includes at least the second trench dielectric material 24. In some embodiments, the passive device region-logic device region second trench isolation structure, S2, is entirely composed of the second trench dielectric material 24. In other embodiments, the passive device region-logic device region second trench isolation structure, S2, further includes third trench dielectric material 26 located entirely above the second trench dielectric material 24. In such embodiments, the third trench dielectric material 26 is compositionally different from the second trench dielectric material 24. In some embodiments, in which the third trench dielectric material 26 is present, the third trench dielectric material 26 is compositionally the same as the first trench dielectric material 22; that is the third trench dielectric material 26 and the first trench dielectric material 22 are composed of a compositionally same trench dielectric material. In yet other embodiments, in which the third trench dielectric material 26 is present, the third trench dielectric material 26 is compositionally different from the first trench dielectric material 22. These embodiments illustrate the design flexibility of the present application and indicate that the different trench isolation trenches are applicable for logic and passive devices.

In some embodiments, the passive device region 102 includes at least one passive device such as, for example, an electrostatic discharge protection diode (including well region 15B, doped region 15A and source/drain region 38C shown in FIG. 18B). This diode provides electrostatic discharge protection to the structure. In the present application, source/drain region 38C contains a different conductivity dopant than the dopant present in doped region 15A and well region 15B. Other passive devices are contemplated and can be used in the present application instead of the diode illustrated in FIG. 18B.

In some embodiments and as illustrated in FIG. 18B, the semiconductor structure including the diode further includes frontside contact structure 48B contacting a first surface of the at least one electrostatic discharge protection diode, and backside contact structure 58C contacting a second surface of the at least one electrostatic discharge protection diode, wherein the second surface is opposite the first surface. In such diode-containing embodiments, frontside contact structure 48B electrically connects the at least one electrostatic discharge protection diode to frontside BEOL structure 46, and backside contact structure 58C electrically connects the at least one electrostatic discharge protection diode to additional backside BEOL structure 62 via a VSS power rail, VSS, that is present in an initial backside BEOL structure. These embodiments illustrate the frontside and backside wiring in the passive device region 102.

Figure 1B:
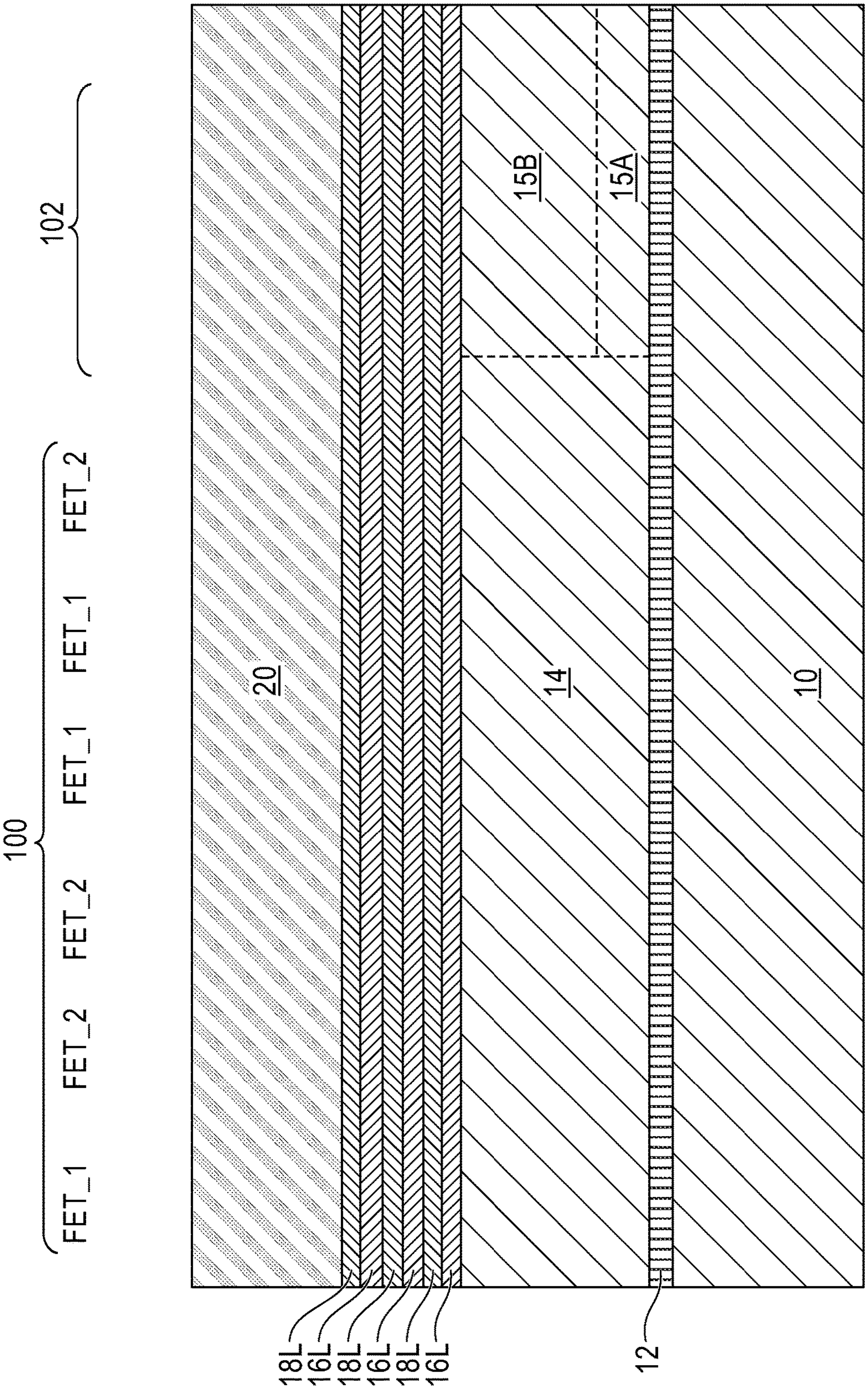
FIG. 1B is a cross source/drain sectional view of the exemplary semiconductor structure illustrated in FIGS. 1A and 1*n* both the logic device region and an adjacent passive device region.

Referring now to FIG. 1A, there is illustrated a cross gate sectional view of an exemplary semiconductor structure in a logic device region 100 that can be employed in one embodiment of the present application. FIG. 1B is a cross source/drain sectional view of the exemplary semiconductor structure illustrated in FIGS. 1A and 1*n* both the logic device region 100 and an adjacent passive device region 102. The exemplary structure illustrated in FIGS. 1A-1B includes a material stack of alternating sacrificial semiconductor material layers 16L and semiconductor channel material layers 18L located on a substrate 10/12/14, and a hard mask layer 20 located on the material stack. In some embodiments of the present application, the passive device region 102 can be omitted.

In embodiments of the present application, the substrate 10/12/14 can include a first semiconductor layer 10, an etch stop layer 12 and a second semiconductor layer 14. The first semiconductor layer 10 is composed of a first semiconductor material. The second semiconductor layer 14 is composed of a second semiconductor material. The term "semiconductor material" is used throughout the present application to denote a material having semiconducting properties. Examples of semiconductor materials that can be used in the present application in providing the first semiconductor material and the second semiconductor material include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material that provides the second semiconductor layer 14 can be compositionally the same as, or compositionally different from, the first semiconductor material that provides the first semiconductor layer 10. In some embodiments of the present application, the etch stop layer 12 can be composed of a dielectric material such as, for example, silicon dioxide and/or boron nitride. In other embodiments of the present application, the etch stop layer 12 is composed of a third semiconductor material that is compositionally different from the first semiconductor material that provides the first semiconductor layer 10 and the second semiconductor material that provides the second semiconductor layer 14. In one example, the first semiconductor layer 10 is composed of silicon, the etch stop layer 12 is composed of silicon dioxide, and the second semiconductor layer 14 is composed of silicon. In another example, the first semiconductor layer 10 is composed of silicon, the etch stop layer 12 is composed of silicon germanium, and the second semiconductor layer 14 is composed of silicon. The substrate including the first semiconductor layer 10, the etch stop layer 12 and the second semiconductor layer 14 can be formed utilizing techniques well known to those skilled in the art. For example, the etch stop layer 12 can be deposited on the first semiconductor layer 10, and the second semiconductor layer 14 can be deposited on the etch stop layer 12.

Within the passive device region 102, the second semiconductor layer can contain a doped region 15A and an upper well region 15B. The doped region 15A and the upper well region 15B are elements of an electrostatic discharge protection diode that can be present in the passive device region 102. Other passive devices besides the diode can be present in the passive device region 102. The doped region 15A is composed of the second semiconductor material mentioned above. The doped region 15A can be a p-doped region (including a p type dopant as defined herein below) or an n-doped region (including an n-type dopant as defined herein below). The well region 15B is also composed of the second semiconductor material mentioned above. The well region 15B includes a same conductivity type dopant as the doped region 15A. The dopant concentration with the well region 15B is less than the doped concentration of the doped region. In one example, the dopant concentration within the doped region 15A can be in range from 1E20 atoms/$cm^3$ to 1E22 atoms/$cm^3$, while the dopant concentration within the well region 15B can be in range from 1E14 atoms/$cm^3$ to 1E19 atoms/$cm^3$. The doped region 15A and well region 15B can be formed by ion implantation or other suitable techniques that can introduce a dopant into a semiconductor material.

As mentioned above, the material stack includes alternating sacrificial semiconductor material layers 16L and semiconductor channel material layers 18L. In some embodiments and as is illustrated in FIGS. 1A-1B, there is an equal number of sacrificial semiconductor material layers 16L and semiconductor channel material layers 18L. That is, the material stack can include 'n' number of semiconductor channel material layers 18L and 'n' number of sacrificial semiconductor material layers 16L, wherein n is an integer starting from one. By way of one example, the material stack includes three sacrificial semiconductor material layers 16L and three semiconductor channel material layers 18L. Each sacrificial semiconductor material layer 16L is composed of a fourth semiconductor material, while each semiconductor channel material layer 18L is composed of a fifth semiconductor material that is compositionally different from the fourth semiconductor material; note that the fourth semiconductor material is compositionally different from the second semiconductor material that provides the second semiconductor layer 14 of the substrate 10/12/14.

The fourth semiconductor material that provides each sacrificial semiconductor material layer 16L, and the fifth semiconductor material that provides each semiconductor channel material layer 18L can include one of the semiconductor materials mentioned above. In some embodiments, the fifth semiconductor material that provides each semiconductor channel material layer 18L is capable of providing high channel mobility for n-type FET devices. In other embodiments, the fifth semiconductor material that provides each semiconductor channel material layer 18L is capable of providing high channel mobility for p-type FET devices. In one example, each sacrificial semiconductor material layer 16L is composed of a silicon germanium alloy having a germanium content from 20 atomic percent to 40 atomic percent, and each semiconductor channel material layer 18L is composed of silicon. Other combinations of semiconductor materials are possible and are contemplated herein.

Each sacrificial semiconductor material layer 16L can have a first thickness, and each semiconductor channel material layer 18L can have a second thickness. In the present application, the first thickness can be equal to, greater than, or less than, the second thickness. At this point of the present application, the sacrificial semiconductor material layers 16L and the semiconductor channel material layer 18L that provide the material stack illustrated in FIGS. 1A-1B have a same length.

The material stack including the alternating sacrificial semiconductor material layers 16L and semiconductor channel material layers 18L can be formed on substrate 10/12/14 utilizing successive deposition processes. Each deposition process used in forming the material stack can include, but is not limited to, chemical vapor deposition (CVD), plasma enhanced chemical vapor deposition (CVD) and/or epitaxial growth. The terms "epitaxial growth" or "epitaxially growing" means the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. Notably, a first deposition process (e.g., CVD or epitaxial growth) is used in forming each sacrificial semiconductor material layer 16L of the material stack, while a second deposition process (e.g., CVD or epitaxial growth) is used in forming each semiconductor channel material layer 18L of the material stack.

The hard mask layer 20 is composed of any hard mask dielectric material including, but not limited to, silicon dioxide, silicon nitride and/or silicon oxynitride. The hard mask layer 20 can have a thickness from 25 nm to 100 nm; although other thicknesses for the hard mask layer 20 are contemplated and can be used in the present application. The hard mask layer 20 can be formed on an upper most surface of the material stack utilizing a deposition process such as, for example, CVD, PECVD or physical vapor deposition (PVD).

Figure 2A:
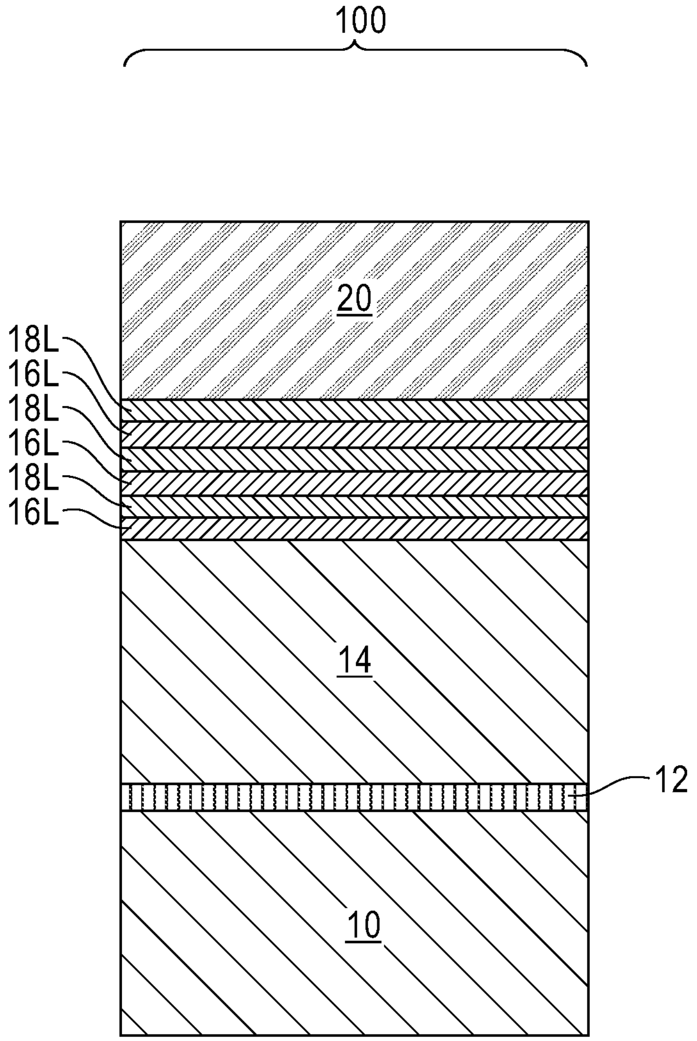
FIGS. 2A and 2B are cross sectional views of the exemplary semiconductor structure shown in FIGS. 1A and 1B, respectively, after performing an active area patterning process in which openings are formed in the hard mask layer, the material stack and the substrate.
Figure 2B:
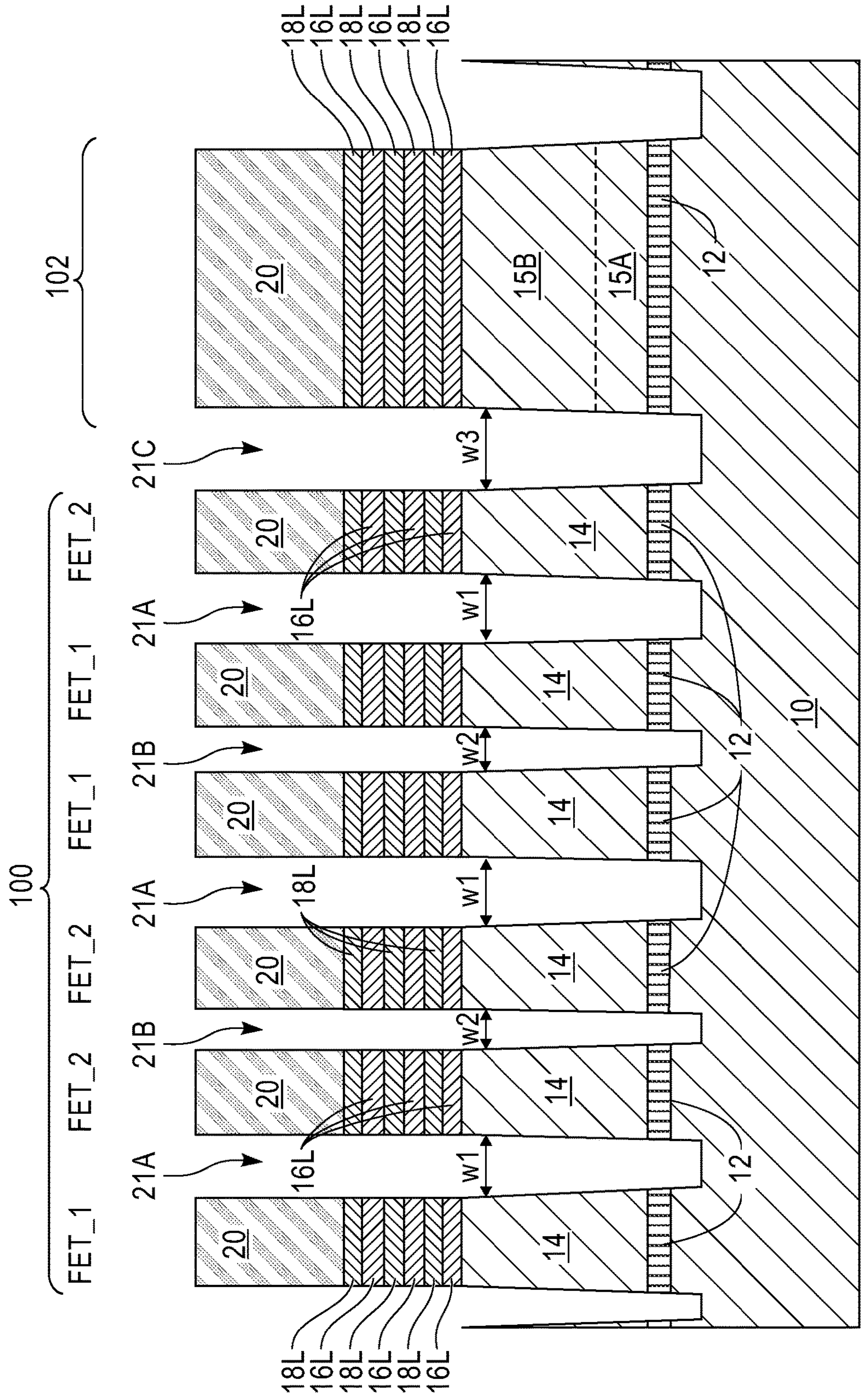

Referring now to FIGS. 2A and 2B, there are illustrated the exemplary semiconductor structure shown in FIGS. 1A and 1B, respectively, after performing an active area patterning process in which openings 21A, 21B and 21C are formed in the hard mask layer 20, the material stack and the substrate 10/12/14. Each opening 21A, 21B and 21C extends entirely through the hard mask layer 20, the sacrificial semiconductor material layers 16L and the semiconductor channel material layers 18L of the material stack, the second semiconductor layer 14 and the etch stop layer 12 and partially into the first semiconductor layer 12. In the present application each opening 21A is a first opening that has a first width, w1, each opening 21B is a second opening that has a second width, w2, and each opening 21C is a third opening having a third width, w3. In the present application, w1 is greater than w2, and w1 can be the same as, or different from, w3. In the present application, w1 is the width between two different conductivity type FETs, while w2 is the width between two neighboring FETs, and w3 is the width between the logic device region 100 and the passive device region 102. Each opening 21A, 21B and 21C stops on a subsurface of the first semiconductor layer 10. In the present application, the term "subsurface" denotes a surface of a material that is located between a topmost surface and a bottommost surface of that material.

Each opening 21A, 21B and 21C can be formed by lithography and etching. Lithography includes forming a photoresist material on a surface of a material or material stack that needs to be patterned, exposing the photoresist material to a desired pattern of irradiation and developing the exposed photoresist material. The pattern provided by the developed photoresist material is then transferred to the material or material stack that needs to be patterned by etching. Etching can include a dry etching process such as, for example, reactive ion etching (RIE), ion beam etching (IBE) or plasma etching, a chemical wet etch process or any combination of dry and/or wet etching. In the present application, the pattern formed into the photoresist material is first transferred into the hard mask layer 20 and then the etch continues or another etching process is used to form the remainder of the openings 21A, 21B, 21C in the material stack and substrate 10/12/14. The patterned photoresist material can be removed utilizing any material removal process after the pattern has been initially transferred into the hard mask layer 20.

This active device area patterning process forms patterned hard mask capped structures in both the logic device region 100 and in the passive device region 102. Within the logic device region 100, each patterned hard mask capped structure includes, from top to bottom, a remaining, i.e., non-etched, portion of the hard mask layer 20, and a remaining, i.e., non-etched, portion of the material stack including remaining, i.e., non-etched, portion of each sacrificial semiconductor material layer 16L and each semiconductor channel material layer 18L. Within the logic device region 100, each patterned hard mask capped structure is located on a remaining, i.e., non-etched, portion of the second semiconductor layer 14, a remaining, i.e., non-etched, portion of the etch stop layer 12, and a pedestal portion of the first semiconductor layer 10. In the illustrated embodiment and by way of one example, six patterned hard mask capped structures are present in the passive device region 102. In the illustrated embodiment, and starting from left to right the, first patterned hard mask capped structure will be used in forming a single first conductive-type FET, i.e., FET_1, the second and third patterned hard mask capped structure will be used in forming two second conductive-type FETs, FET_2, the fourth and fifth patterned hard mask capped structure will be used in forming two first conductive-type FETs, FET_1, while the sixth patterned hard mask capped structure will be used in forming a single second conductivity type FET, FET_1. Although two neighboring first conductivity type FETs, FET_1, and two second conductivity type FETs, FET_2, are described and illustrated, a plurality of neighboring first conductivity type FETs, FET_1, and a plurality of second conductivity type FETs, FET_2 can be formed. The single first conductivity-type FET, FET_1, and/or the single second conductivity-type FET, FET_2, can be omitted in some embodiments of the present application.

Within the passive device region 102, each patterned hard mask capped structure includes, from top to bottom, a remaining, i.e., non-etched, portion of the hard mask layer 20, and a remaining, i.e., non-etched, portion of the material stack including remaining, i.e., non-etched, portion of each sacrificial semiconductor material layer 16L and each semiconductor channel material layer 18L. In the illustrated embodiment and by way of one example, only one patterned hard mask capped structure is present in the passive device region 102. Within the passive device region 102, each patterned hard mask capped structure is located on a remaining, i.e., non-etched, portion of both the upper well region 15B and the doped region 15A, a remaining, i.e., non-etched, portion of the etch stop layer 12, and a pedestal portion of the first semiconductor layer 10.

Figure 3A:
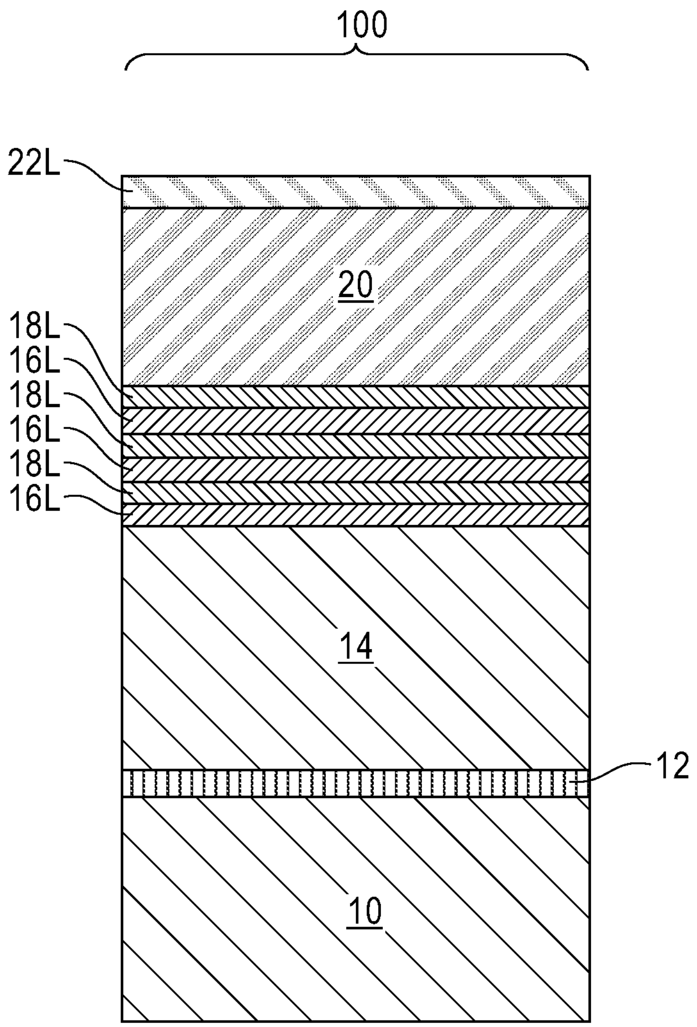
FIGS. 3A and 3B are cross sectional views of the exemplary semiconductor structure shown in FIGS. 2A and 2B, respectively, after forming a conformal trench dielectric layer in each opening and along a sidewall and an uppermost surface each patterned hard mask capped structure created by the previous active area patterning process.
Figure 3B:
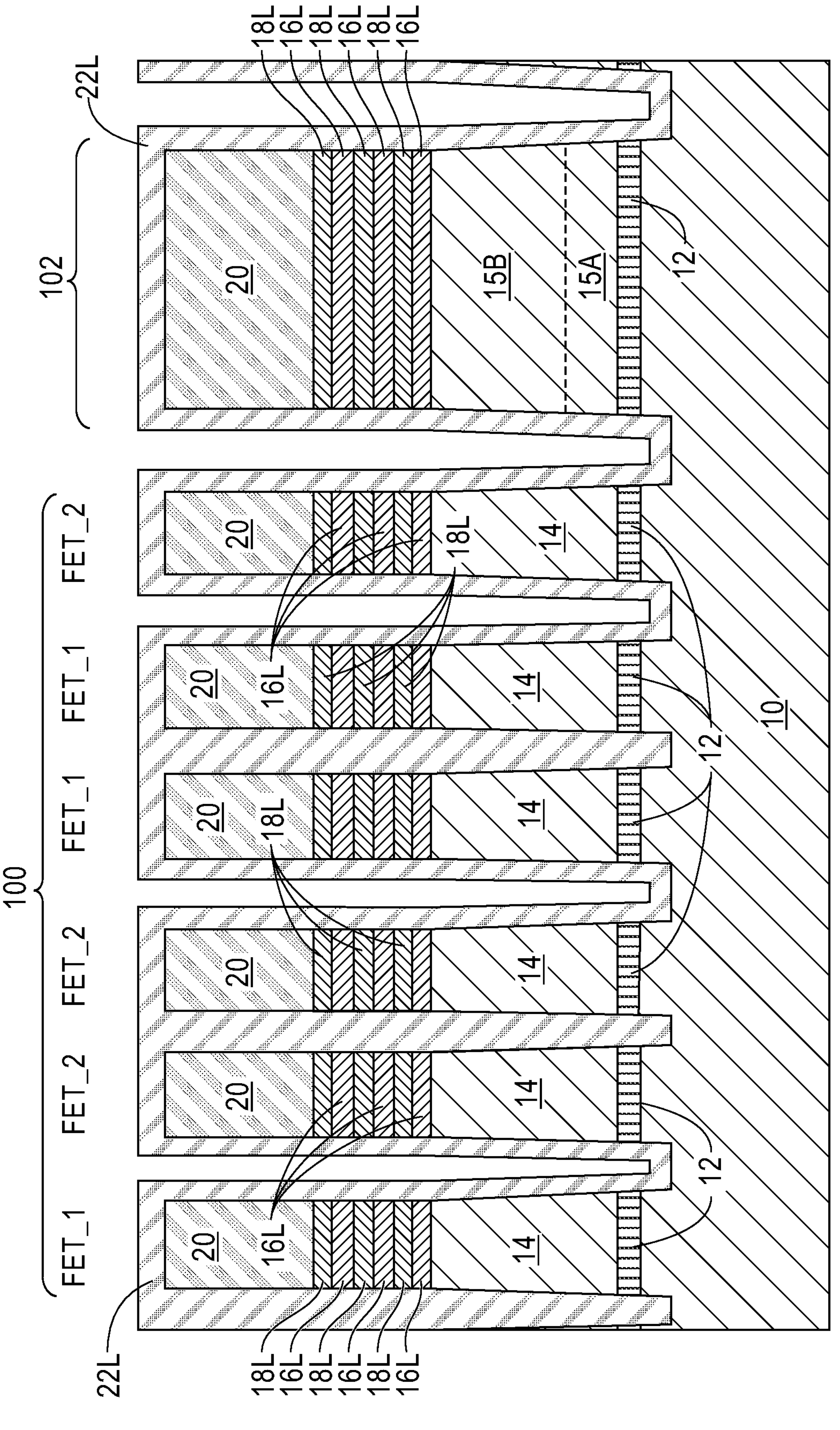

Referring now to FIGS. 3A and 3B, there are illustrated the exemplary semiconductor structure shown in FIGS. 2A and 2B, respectively, after forming a conformal trench dielectric layer 22L in each opening 21A, 21B, 21C and along a sidewall and an uppermost surface of each patterned hard mask capped structure created by the previous active area patterning process. In the logic device region 100, the conformal trench dielectric layer 22L is also present along sidewalls of the remaining portion of the second semiconductor layer 14, the remaining portion of the etch stop layer 12, and the pedestal portion of the first semiconductor layer 10. In the passive device region 102, the conformal trench dielectric layer 22L is also present along sidewalls of the remaining portions of both the upper well region 15B and the doped region 15A, a remaining portion of the etch stop layer 12, and the pedestal portion of the first semiconductor layer 10. Within each of the logic device region 100 and the passive device region 102, the conformal trench dielectric layer 22L is present on a subsurface of the first semiconductor layer 10.

The conformal trench dielectric layer 22L is composed of a first trench dielectric material. The first trench dielectric material can include, for example, silicon dioxide, or a low k (less than 4.0) oxide or a thin layer of silicon nitride followed by a layer of silicon dioxide. The term "conformal" when used in conjunction with the term "layer" denotes that the layer has a thickness as measured along a horizontal surface of a structure/material that is the same as the thickness as measured from a vertical surface of the same structure/material. The conformal trench dielectric layer 22L can be formed utilizing a conformal deposition process including for example, CVD or PECVD. The conformal trench dielectric layer 22L can have a thickness of from 5 nm to 25 nm. In the present application, the conformal trench dielectric layer 22L completely fills each second opening 21B, while partially filling each first opening 21A and each third opening 21C.

Figure 4A:
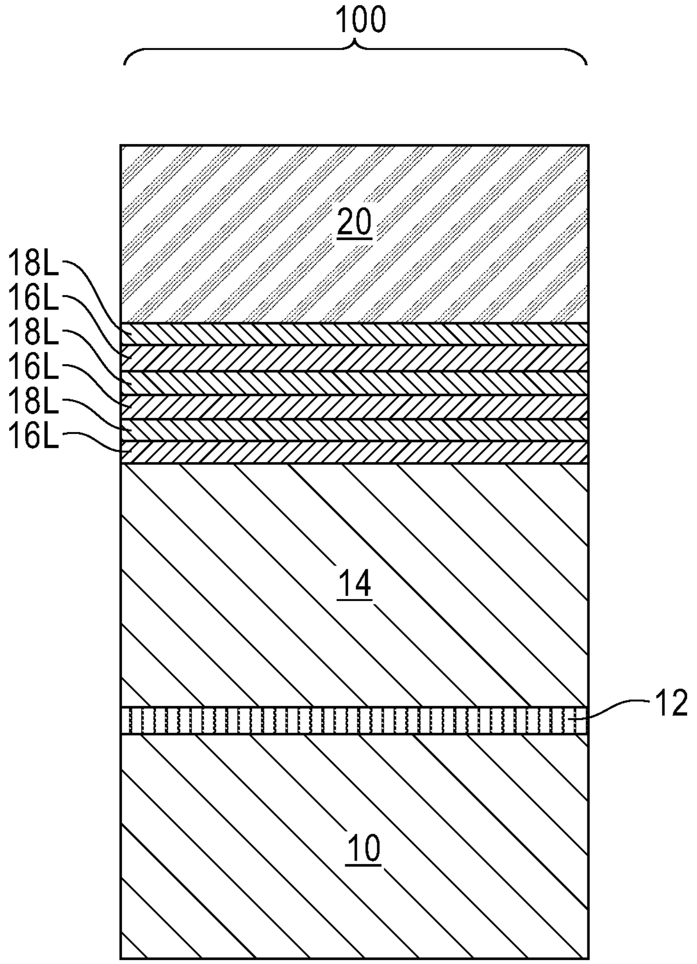
FIGS. 4A and 4B are cross sectional views of the exemplary semiconductor structure shown in FIGS. 3A and 3B, respectively, after removing the conformal trench dielectric layer from selective openings in which the conformal trench dielectric layer only partially filled the opening.
Figure 4B:
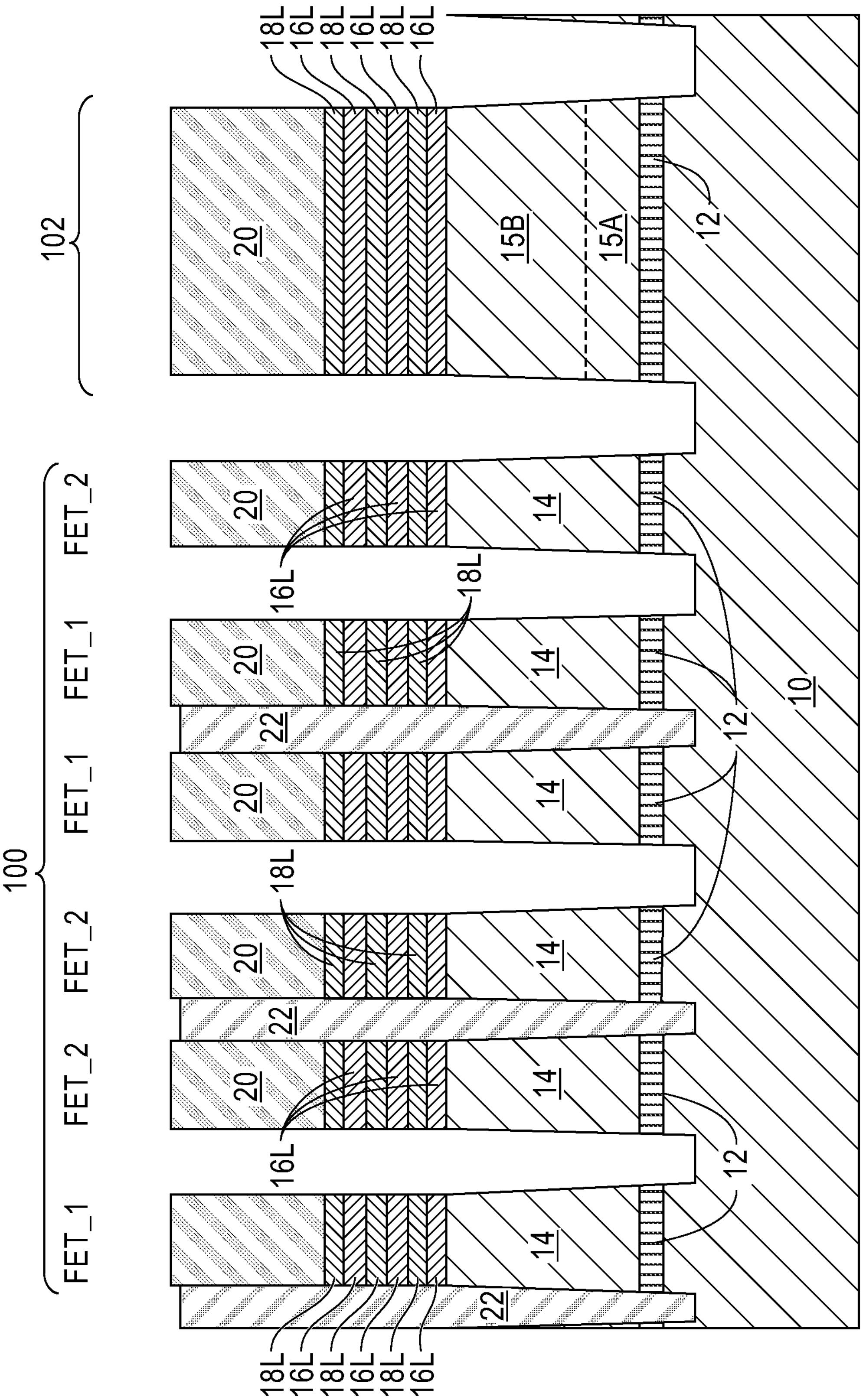

Referring now to FIGS. 4A and 4B, there are illustrated the exemplary semiconductor structure shown in FIGS. 3A and 3B, respectively, after removing the conformal trench dielectric layer 22L from selective openings in which the conformal trench dielectric layer only partially filled the opening, i.e., the conformal trench dielectric layer 22L is removed from the first openings 21A and the third openings 21C, but retained in the second openings 21B. The removal of the removing the conformal trench dielectric layer 22L from selective openings i.e., first openings 21A and third openings 21C, can include an isotropic etch back process. Note that the conformal trench dielectric layer 22L remains in each of the second openings 21B. The conformal trench dielectric layer 22L that remains in each of the second openings 21B can be referred to herein as first trench dielectric material 22.

Figure 5A:
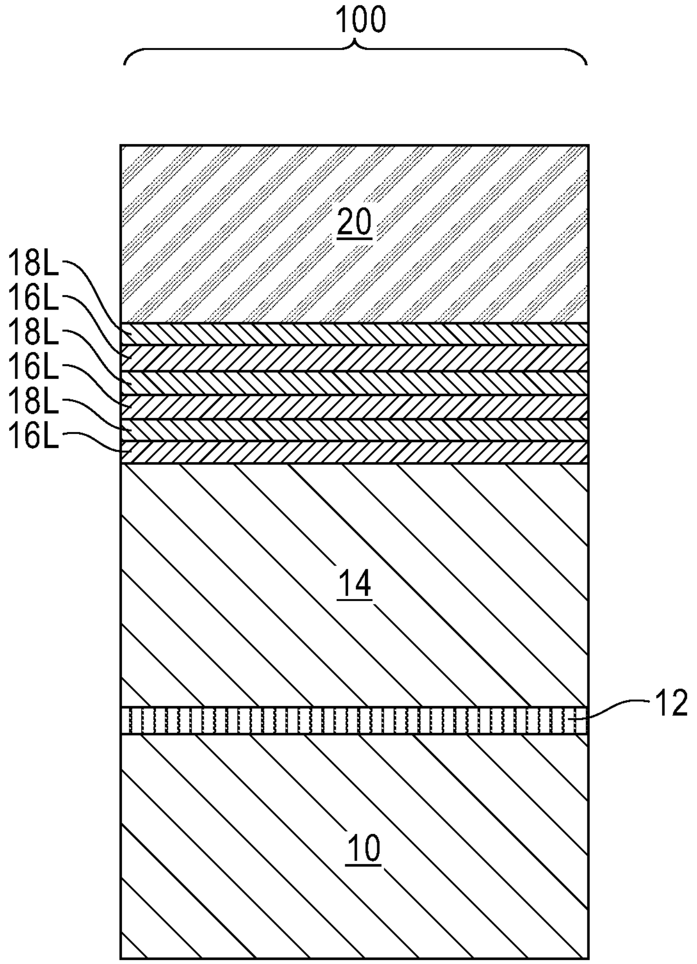
FIGS. 5A and 5B are cross sectional views of the exemplary semiconductor structure shown in FIGS. 4A and 4B, respectively, after forming a second trench dielectric material in a bottom portion of each of the openings in which the conformal trench dielectric layer had been previously removed therefrom.
Figure 5B:
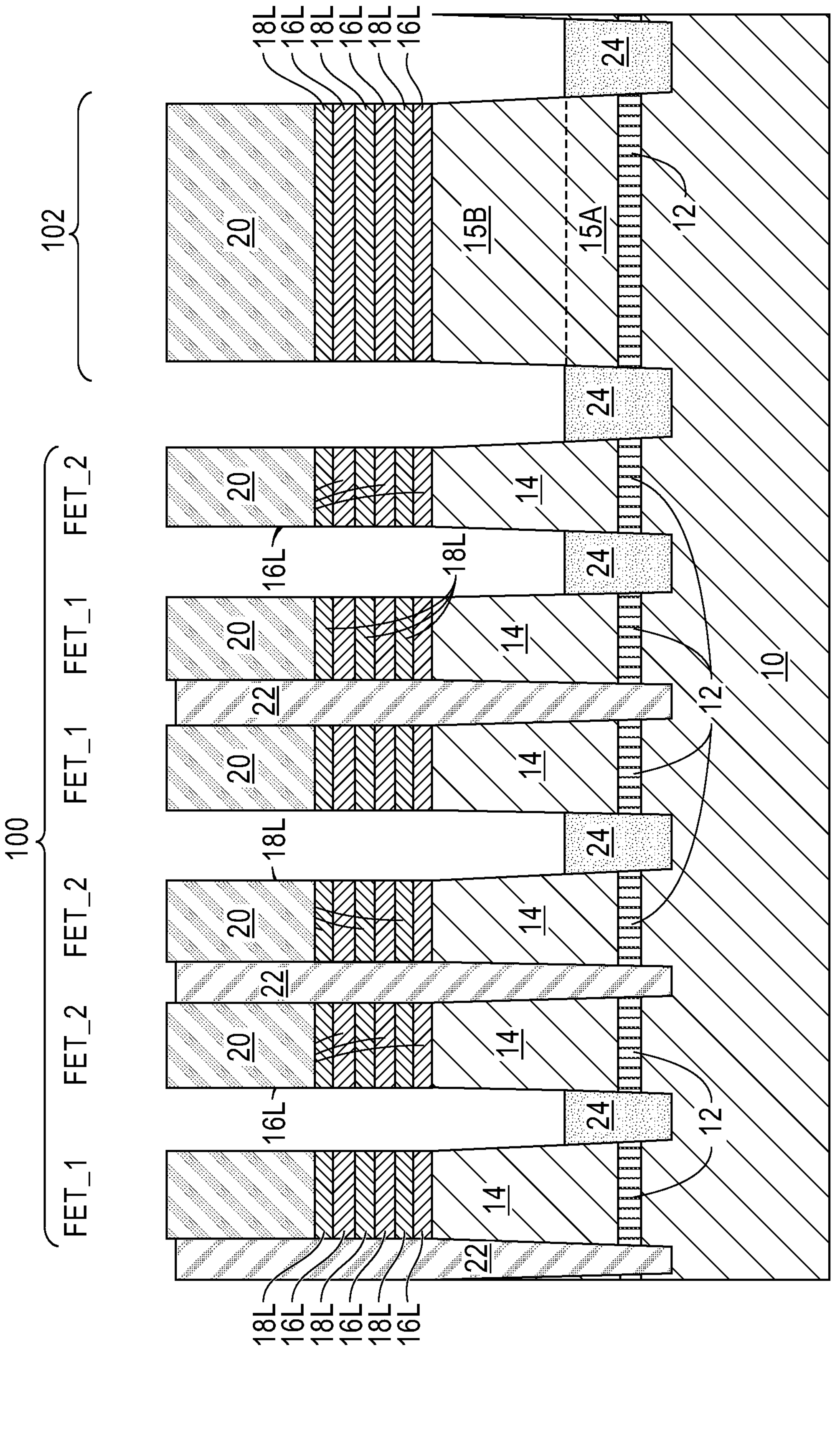
Figure 6A:
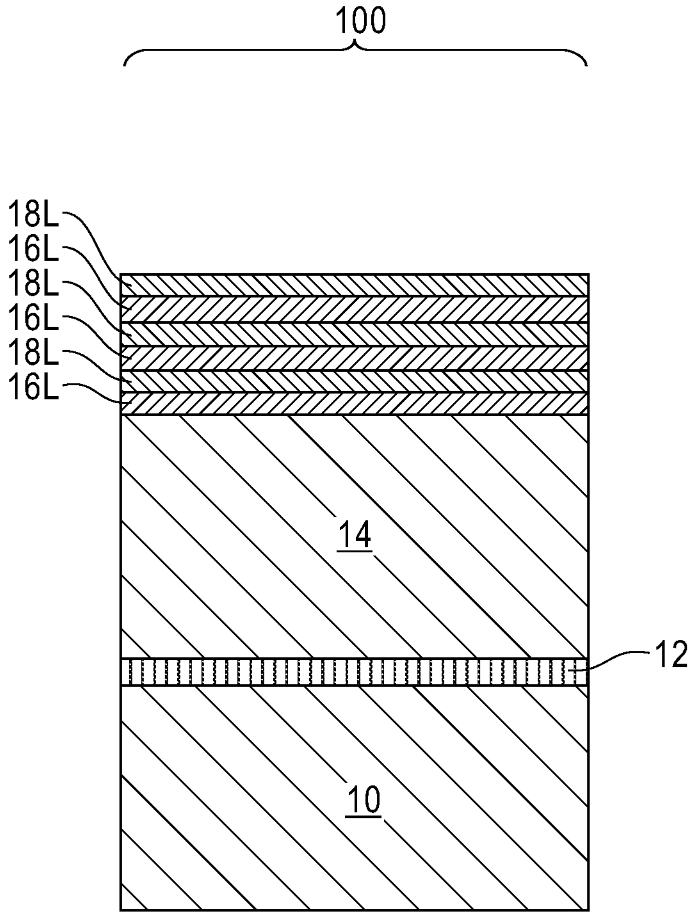
FIGS. 6A and 6B are cross sectional views of the exemplary semiconductor structure shown in FIGS. 5A and 5B, respectively, after forming a third trench dielectric material on the second trench dielectric material.
Figure 6B:
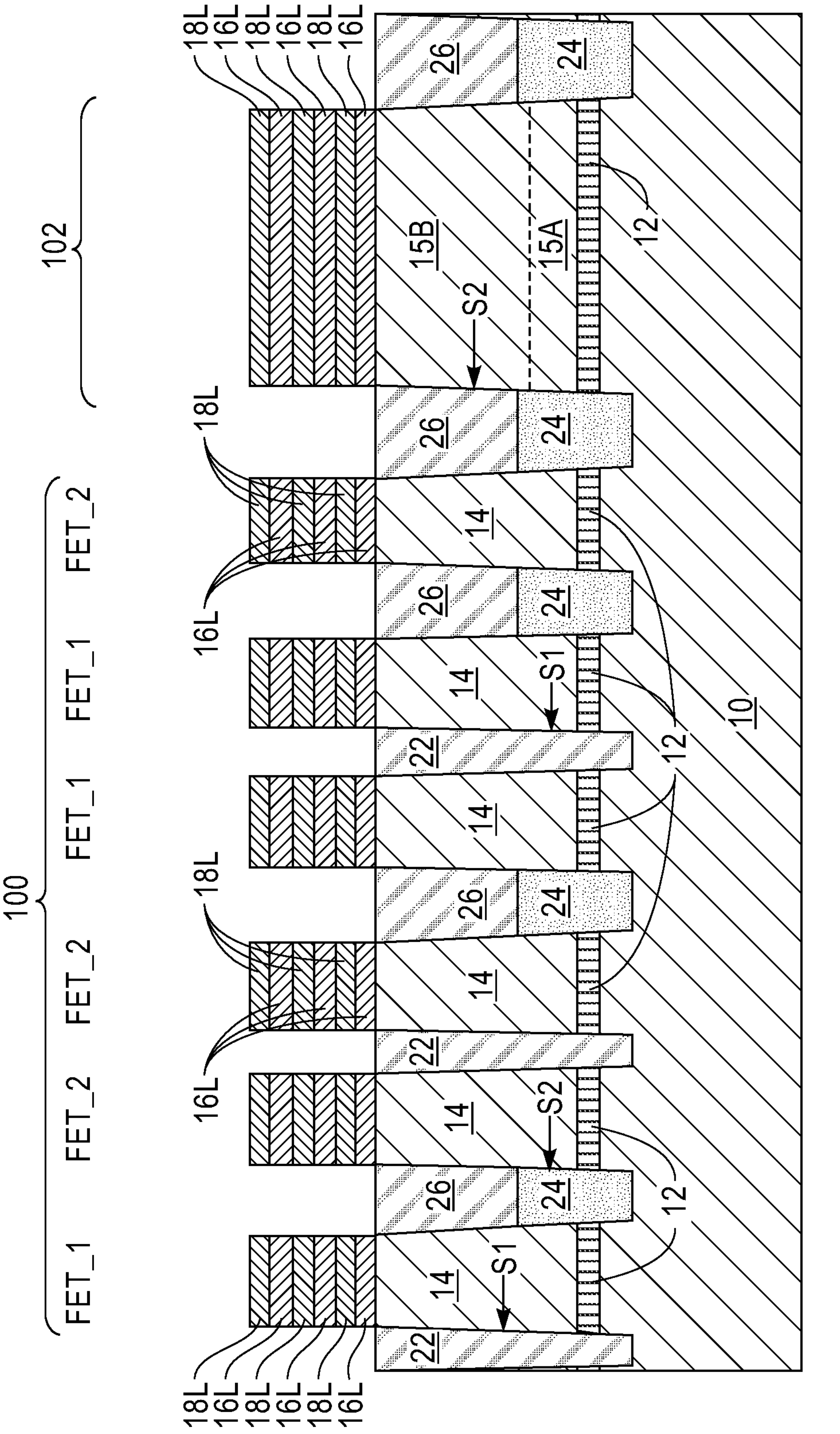

Referring now to FIGS. 5A and 5B, there are illustrated the exemplary semiconductor structure shown in FIGS. 4A and 4B, respectively, after forming a second trench dielectric material 24 in a bottom portion of each of the openings (i.e., the first openings 21A and third openings 21C) in which the conformal trench dielectric layer 22L had been previously removed therefrom. The second trench dielectric material 24 is compositionally different from the first trench dielectric material that provided the conformal trench dielectric layer 22L. Exemplary trench dielectric materials that can be used as the second dielectric material 24 include, but are not limited to, SiOC, SiC, $AlN_x$, $AlO_x$, $HfO_2$ or silicon nitride. The second trench dielectric material 24 can be formed by a flowable deposition process. A recess etch can then be used to reduce the height of the deposited second trench dielectric material 24. The second trench dielectric material 24 typically has a height that is positioned between a topmost surface and bottommost surface of the second semiconductor layer 14. In some embodiments of the present application, the second trench dielectric material 24 is not subjected to any recess etch and no third trench dielectric material as described in FIGS. 6A-6B is formed. In such embodiment, the second trench dielectric material 24 would fill in the entirety of the openings 21A and 21C.

Referring now to FIGS. 6A and 6B, there are illustrated the exemplary semiconductor structure shown in FIGS. 5A and 5B, respectively, after forming a third trench dielectric material 26 on the second trench dielectric material 24. The formation of the third trench dielectric material 26 is optional in some embodiments of the present application. As is shown, the second trench dielectric material 24 is located entirely beneath the third trench dielectric material 26. The third trench dielectric material 26 is compositionally different from the second trench dielectric material 24. The third trench dielectric material 26 can be compositionally the same as, or compositionally different from, the first trench dielectric material that provided the conformal trench dielectric layer 22L. Typically, and for easy of production, the third trench dielectric material 26 is compositionally the same as the first trench dielectric material that is used in providing the conformal trench dielectric layer 22L. Exemplary trench dielectric materials that can be used as the third trench dielectric material 26 include, but are not limited to, silicon dioxide, a low k oxide, or a thin layer of silicon nitride and a layer of silicon dioxide. The third trench dielectric material 26 is formed by a deposition process such as, for example, CVD or PECVD. A recess etch can then be used to reduce the height of the as deposited third dielectric material 26. During this recess etch, or another subsequently performed recess etch, the height of the first trench dielectric material 22 can be reduced. At this point of the present application, each of the third trench dielectric material 26 and the first trench dielectric material 24 has a topmost surface that is substantially coplanar (within +10 nm) of the topmost surface of the second semiconductor layer 14 of the substrate. In some embodiments, in which the second trench dielectric material 24 is not subjected to a recess etching process, the formation of the third trench dielectric material 26 can be omitted.

Following the formation of the third trench dielectric material 26, the hard mask layer 20 is removed from on top of each patterned hard mask capped structure utilizing a material removal process such as, for example, planarization. The planarization can include chemical mechanical polishing (CMP).

Two different trench isolation structures are formed in the present application. The first trench isolation structure, S1, is located in a space between each neighboring pair of first conductivity type FETs and between each neighboring pair of second conductivity type FETs. The first trench isolation structure, S1, includes the first trench dielectric material 22 as a sole trench dielectric material. The second trench isolation structure, S2, is located in a space between each neighboring pair of first conductivity type FETs and second conductivity type FETs as well as between the space between the logic device region 100 and the passive device region 102. The second trench isolation structure includes at least the second trench dielectric material 24. In embodiments, the second trench isolation structure is entirely composed of the second trench dielectric material 24. In other embodiments, the second trench isolation structure can be composed of a bilayer stack of the second trench dielectric material 24 and the third trench dielectric material 26.

Figure 7A:
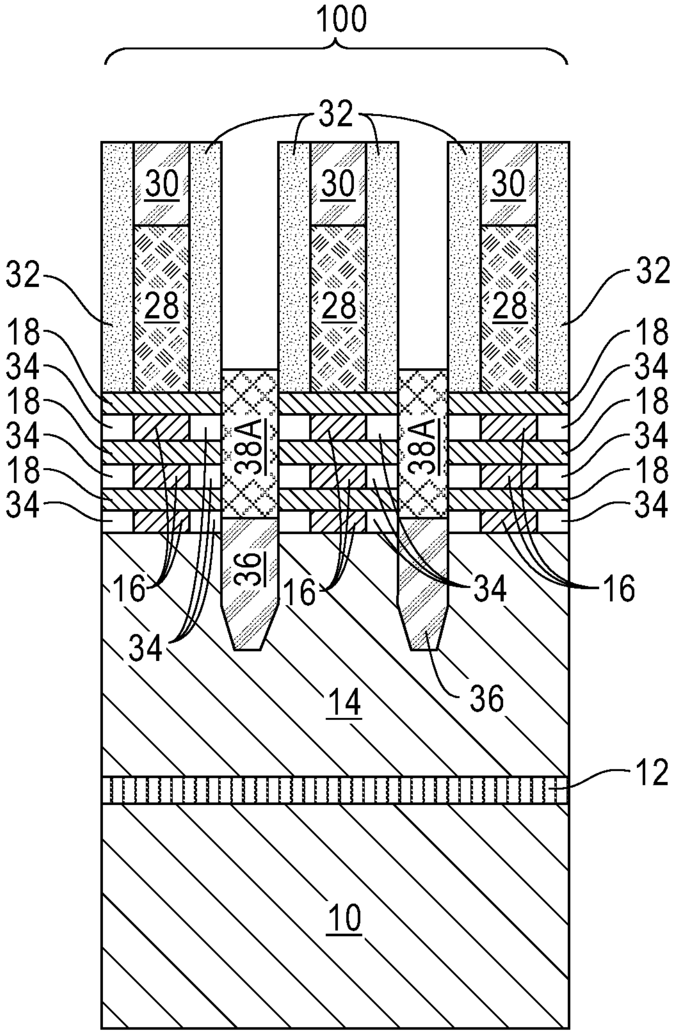
FIGS. 7A and 7B are cross sectional views of the exemplary semiconductor structure shown in FIGS. 6A and 6B, respectively, after nanosheet device processing including formation of sacrificial gate structures, gate spacers, nanosheet stacks, inner spacers, backside contact placeholder structures and source/drain regions, each nanosheet stack including alternating sacrificial semiconductor material nanosheets and semiconductor channel material nanosheets.
Figure 7B:
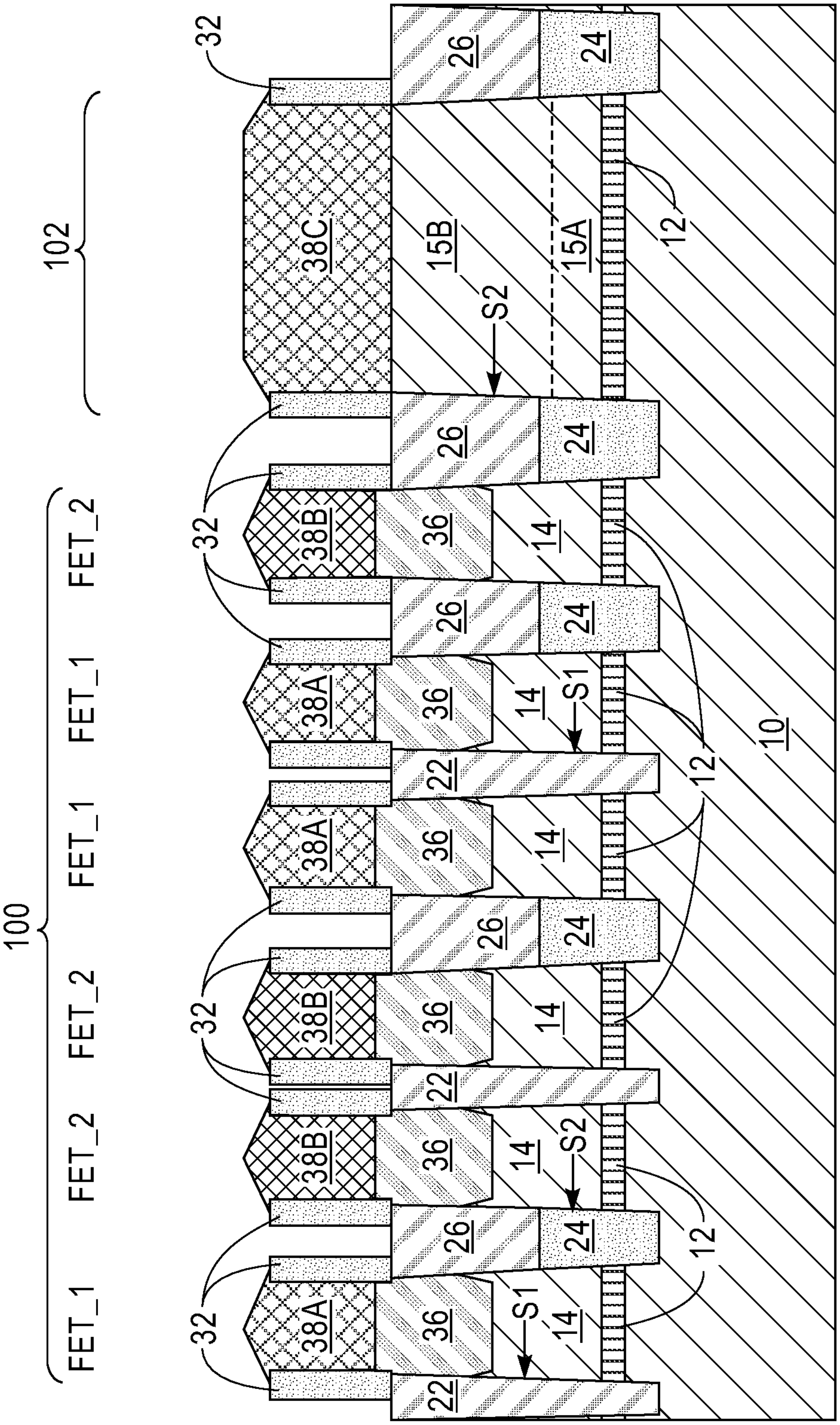

Referring now to FIGS. 7A and 7B, there are illustrated the exemplary semiconductor structure shown in FIGS. 6A and 6B, respectively, after nanosheet device processing including formation of sacrificial gate structures 28, gate spacers 32, nanosheet stacks, inner spacers 34, backside contact placeholder structures 36 and source/drain regions 38A, 38B and 38C. Each nanosheet stack that is formed includes alternating sacrificial semiconductor material nanosheets 16 and semiconductor channel material nanosheets 18. Each sacrificial gate structure 28 can be capped with a sacrificial gate cap 30. In some embodiments, the sacrificial gate cap 30 can be omitted.

Each sacrificial gate structure 28 (three of which are shown by way of one example in FIG. 7A) includes at least a sacrificial gate material. In some embodiments, each sacrificial gate structure 28 can also include a sacrificial gate dielectric material. In such embodiments, the sacrificial gate dielectric material would be located beneath the sacrificial gate material. The optional sacrificial gate dielectric material can be composed of a dielectric material such as, for example, silicon dioxide. The sacrificial gate material can be composed of, for example, polysilicon, amorphous silicon, amorphous silicon germanium or amorphous germanium.

The sacrificial gate cap 30 is composed of a hard mask material such as, for example, silicon nitride. As mentioned above, and in some embodiments, the sacrificial gate cap 30 can be omitted from on top of the sacrificial gate structure 28.

The sacrificial gate structure 28 and sacrificial gate cap 30 can be formed by first depositing the material(s) that provide the sacrificial gate structure, followed by second depositing the hard mask material that provides the sacrificial gate cap 30. These deposited materials are then patterned by lithography and etching forming the sacrificial gate structures 28 and the sacrificial gate caps 30.

Next, gate spacers 32 are formed. The gate spacers 32 is composed of a dielectric spacer material including, but not limited to, silicon dioxide, SiN, SiBCN, SiOCN or SiOC. The gate spacers 32 can be formed utilizing a deposition process including, for example, CVD, PECVD or atomic layer deposition (ALD). A spacer etch can follow the deposition process.

After forming the spacer spacers 32, the nanosheet stacks are formed utilizing each structural combination of gate spacer 32, sacrificial gate structure 28 and, if present, the sacrificial gate cap 30 as an etch mask. Notably, the nanosheet stacks are formed by etching through the remaining portion of the material stacks including the remaining portion of each sacrificial semiconductor material layer 16L and the remaining portion of each semiconductor channel material layer 18L, utilizing the etch mask defined above. Each nanosheet stack that is formed includes alternating sacrificial semiconductor material nanosheets 16 (i.e., a second remaining portion of each of the sacrificial semiconductor material layers 16L) and semiconductor channel material nanosheets 18 (i.e., a second remaining portion of each of the semiconductor channel material layers 18L). At this point, each sacrificial semiconductor material nanosheet 16 has a same length as each semiconductor channel material nanosheet 18.

Next, inner spacers 34 are formed. The inner spacers 34 are formed by first subjecting each sacrificial semiconductor material nanosheet 16 to a lateral etch that removes end portions each of the sacrificial semiconductor material nanosheets 16. This lateral etch reduces the length of the original sacrificial semiconductor material nanosheets 16. One of the inner spacers 34 is then formed at the ends of each sacrificial semiconductor material nanosheet 16 that were subjected to the lateral etch. The inner spacer 34 is composed of one of dielectric spacer materials mentioned above. The dielectric spacer material that provides each inner spacer 34 can be compositionally the same as, or compositionally different from, the dielectric spacer material that provides the gate spacer 32. Inner spacer 34 can be formed by a deposition process, followed by a spacer etch.

After inner spacer 34 formation, the backside contact placeholder structures 36 are formed. The backside contact placeholder structures 36 are formed in selective locations of the structure by etching into an upper portion of the second semiconductor layer 14 of the substrate. The openings created by this etch are then filled (by a deposition process such as, for example, epitaxy, CVD or PECVD) with a sacrificial material such as, for example, SiGe, TiOx, or AlOx, and a recess etch can be performed to provide the backside contact placeholder structures 36 illustrated in FIGS. 7A and 7B.

Next, source/drain regions 38A, 38B and 38C are formed. In the present application, source/drain regions 38A are source/drain regions of the first conductivity type FET, FET_1, source/drain regions 38B are source/drain regions of the second conductivity type FET, FET_2, and source/drain regions 38C are source/drain regions of the passive device that is present in the passive device region 102. Source/drain regions 38C form one of the conductive elements of the diode in the passive device region 102. The source/drain regions 38A, 38B and 38C are typically formed by an epitaxial growth process as defined above. The source/drain regions 38A that are associated with each first conductivity type FET, FET_1, extend outward from a sidewall of each semiconductor channel material nanosheet 18, the source/drain regions 38B that are associated with each second conductivity type FET, FET_2, extend outward from a sidewall of each semiconductor channel material nanosheet 18, and the both source/drain regions 38A and 38B are present on a surface of one of the backside contact placeholder structures 36. The source/drain regions 38C of the passive device is located on a surface of well region 15B. Each of the source/drain regions 38A, 38B and 38C is formed between portions of the gate spacer 38 as is shown in FIG. 7B of the present application.

Each of the source/drain regions 38A, 38B and 38C is composed of a semiconductor material and a dopant. As used herein, a "source/drain" region can be a source region or a drain region depending on subsequent wiring and application of voltages during operation of the transistor. The semiconductor material that provides each of the source/drain regions 38A, 38B and 38C is composed of one of the semiconductor materials mentioned above. The semiconductor material that provides the source/drain regions 38A and 38B can be compositionally the same, or compositionally different from each semiconductor channel material nanosheet 18. The semiconductor material that provides each source/drain region 38A and 38B is however compositionally different from each sacrificial semiconductor material nanosheet 16. The dopant that is present in the source/drain regions 38A, 38B and 38C can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each of the source/drain regions can have a dopant concentration of from $4\times10^{20}$ atoms/cm$^3$ to $3\times10^{21}$ atoms/cm$^3$.

The dopant within source/drain regions 38A is of a different conductivity type as the dopant within source/drain regions 38B and is dependent on the conductivity type of the FET that is to be formed. In one example, and when each first conductivity type FET, FET_1, is a pFET and each second conductivity type FET, FET_2, is an nFET, each source/drain region 38A includes a p-type dopant and each source/drain region 38B includes an n-type dopant. In another example, and when each first conductivity type FET, FET_1, is an nFET and each second conductivity type FET, FET_2, is a pFET, each source/drain region 38A includes an n-type dopant and each source/drain region 38B includes a p-type dopant. The dopant within source/drain region 38C is opposite the dopant type that is present in doped region 15A and well region 15B.

Figure 8A:
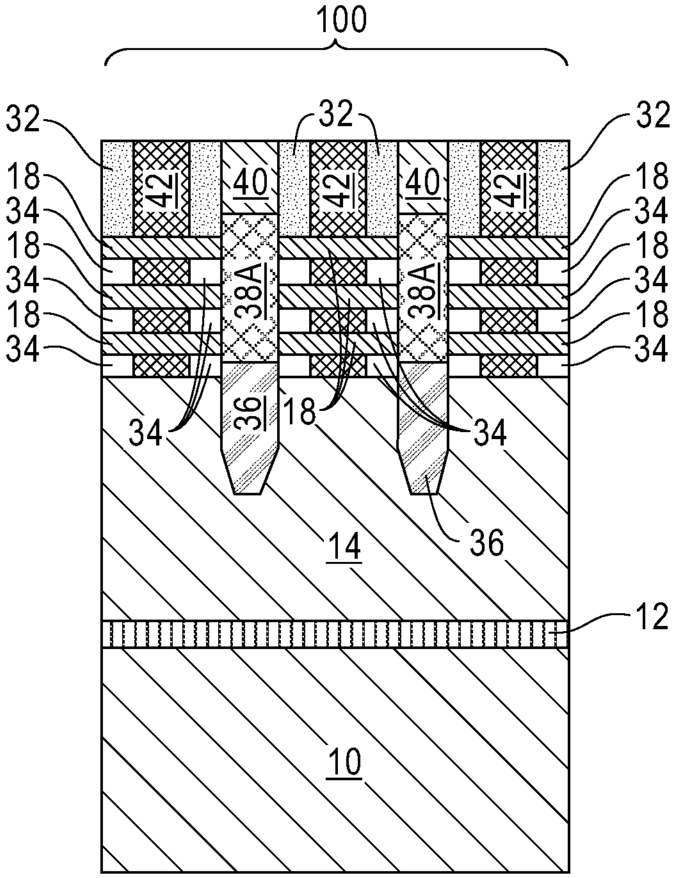
FIGS. 8A and 8B are cross sectional views of the exemplary semiconductor structure shown in FIGS. 7A and 7B, respectively, after further nanosheet device processing including forming a first frontside interlayer dielectric (ILD) layer, removing the sacrificial gate structures to reveal each nanosheet stack, removing the sacrificial semiconductor material nanosheets from each of the revealed nanosheet stacks, and forming a gate structure.
Figure 8B:
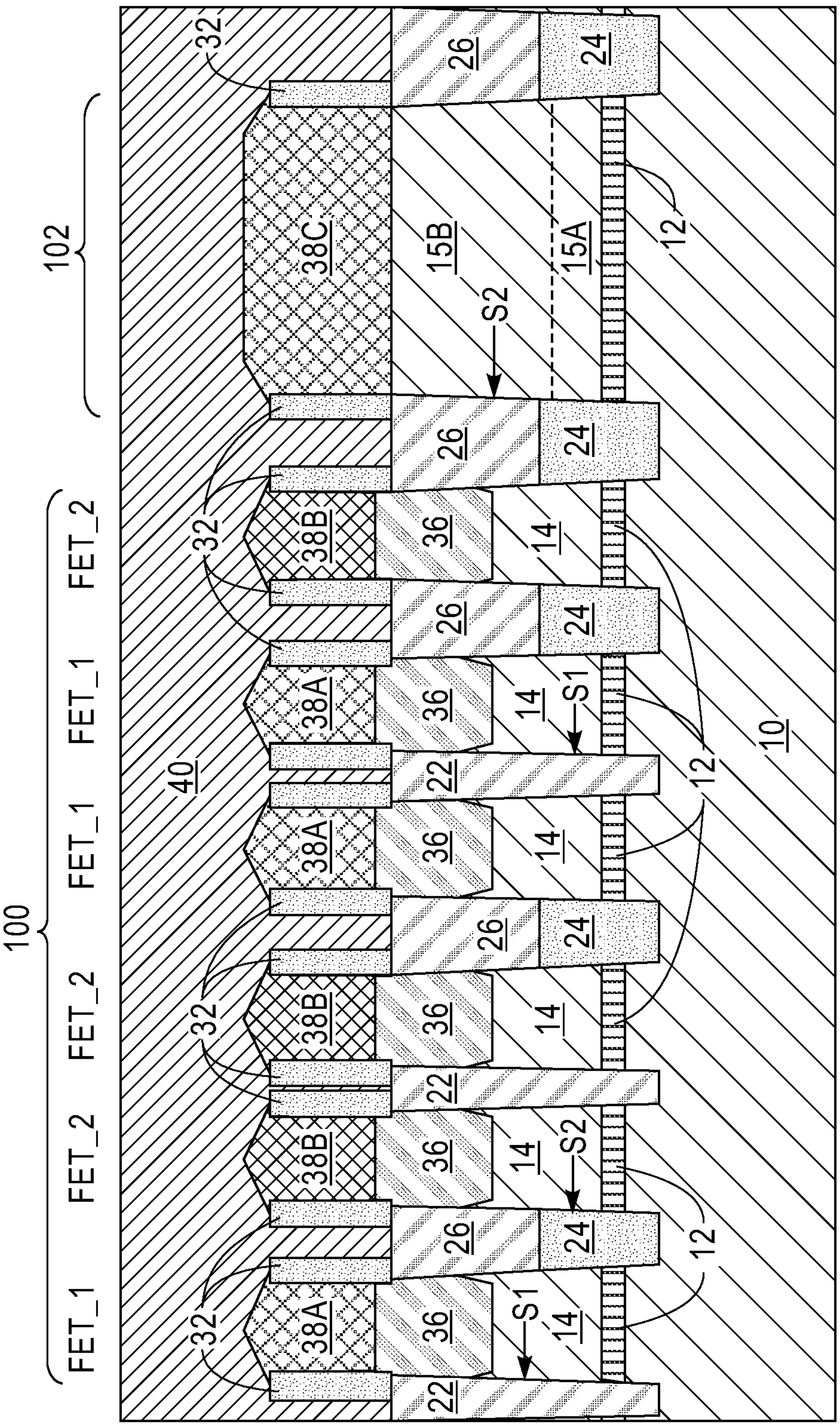

Referring now to FIGS. 8A and 8B, there are illustrated the exemplary semiconductor structure shown in FIGS. 7A and 7B, respectively, after further nanosheet device processing including forming a first frontside ILD layer 40, removing the sacrificial gate structures 28 to reveal each nanosheet stack, removing the sacrificial semiconductor material nanosheets 16 from each of the revealed nanosheet stacks, and forming a gate structure 42.

The frontside ILD material layer 40 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). The frontside ILD material layer 40 can be formed by a deposition process including, by not limited to, CVD, PECVD or spin-on coating. A planarization process such as, for example, CMP, follows the deposition process. This planarization process removes each of the sacrificial gate caps 30 and an upper portion of each gate spacer 32. The sacrificial gate structures 28 are physically exposed after this planarization process has been performed.

The physically exposed sacrificial gate structures 28 are removed utilizing any material removal process such as, for example, etching, which is selective in removing the sacrificial gate structures 28. The removal of the sacrificial gate structures 28 reveals each of the nanosheet stacks described above. Next, each sacrificial semiconductor material nanosheet 16 is removed so as to suspend each semiconductor channel material nanosheet 18 within each nanosheet stack. The removal of the sacrificial semiconductor material nanosheets 16 includes any material removal process such as, for example, etching, which is selective in removing the sacrificial semiconductor material nanosheets 16.

Gates structures 42 are then formed. The gate structures 42 include a gate dielectric material and a gate electrode, both of which are not separately shown, but intended to be within region defined by the gate structures 42. As is known to those skilled in the art, the gate dielectric material directly contacts a physically exposed surface(s) of each semiconductor channel material nanosheet, and the gate electrode is formed on the gate dielectric material. The gate dielectric material has a dielectric constant of 4.0 or greater. Illustrative examples of gate dielectric materials include, but are not limited to, silicon dioxide, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb) O). The gate dielectric material can further include dopants such as lanthanum (La), aluminum (Al) and/or magnesium (Mg).

The gate electrode can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate structures 42 can be formed by deposition of the gate dielectric material, and gate electrode material, followed by a planarization process. At this point of the present application, the gate structures 42 have a topmost surface that is coplanar with a topmost surface of the first frontside ILD layer 40.

Figure 9A:
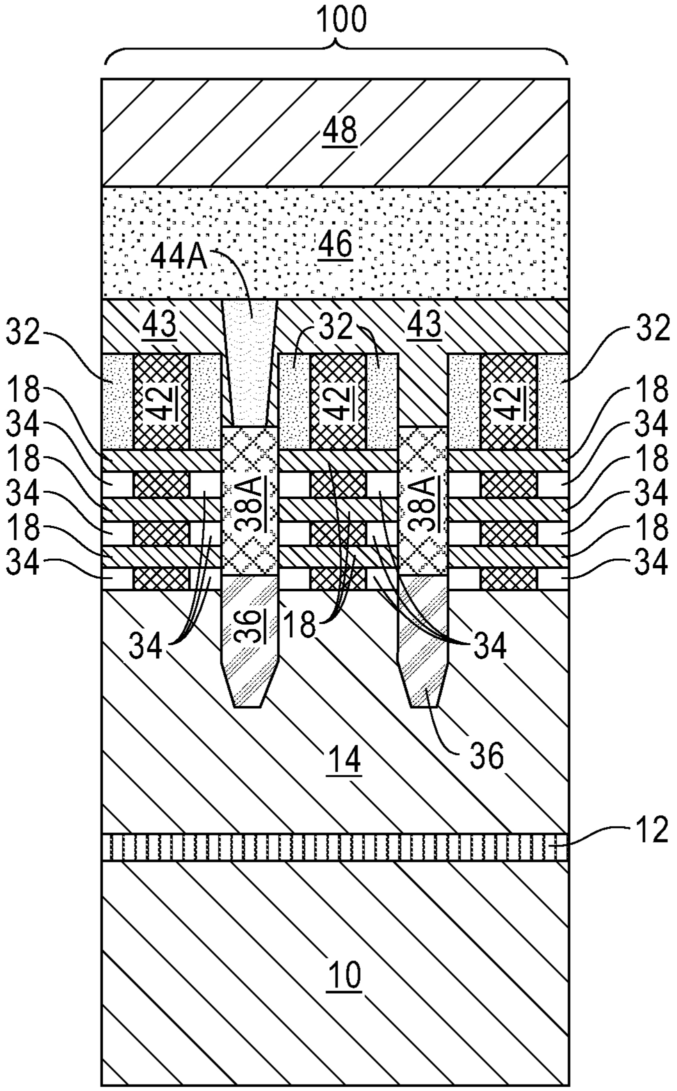
FIGS. 9A and 9B are cross sectional views of the exemplary semiconductor structure shown in FIGS. 8A and 8B, respectively, after forming a second frontside ILD layer, frontside contact structures, a frontside back-end-of-the-line (BEOL) structure and a carrier wafer.
Figure 9B:
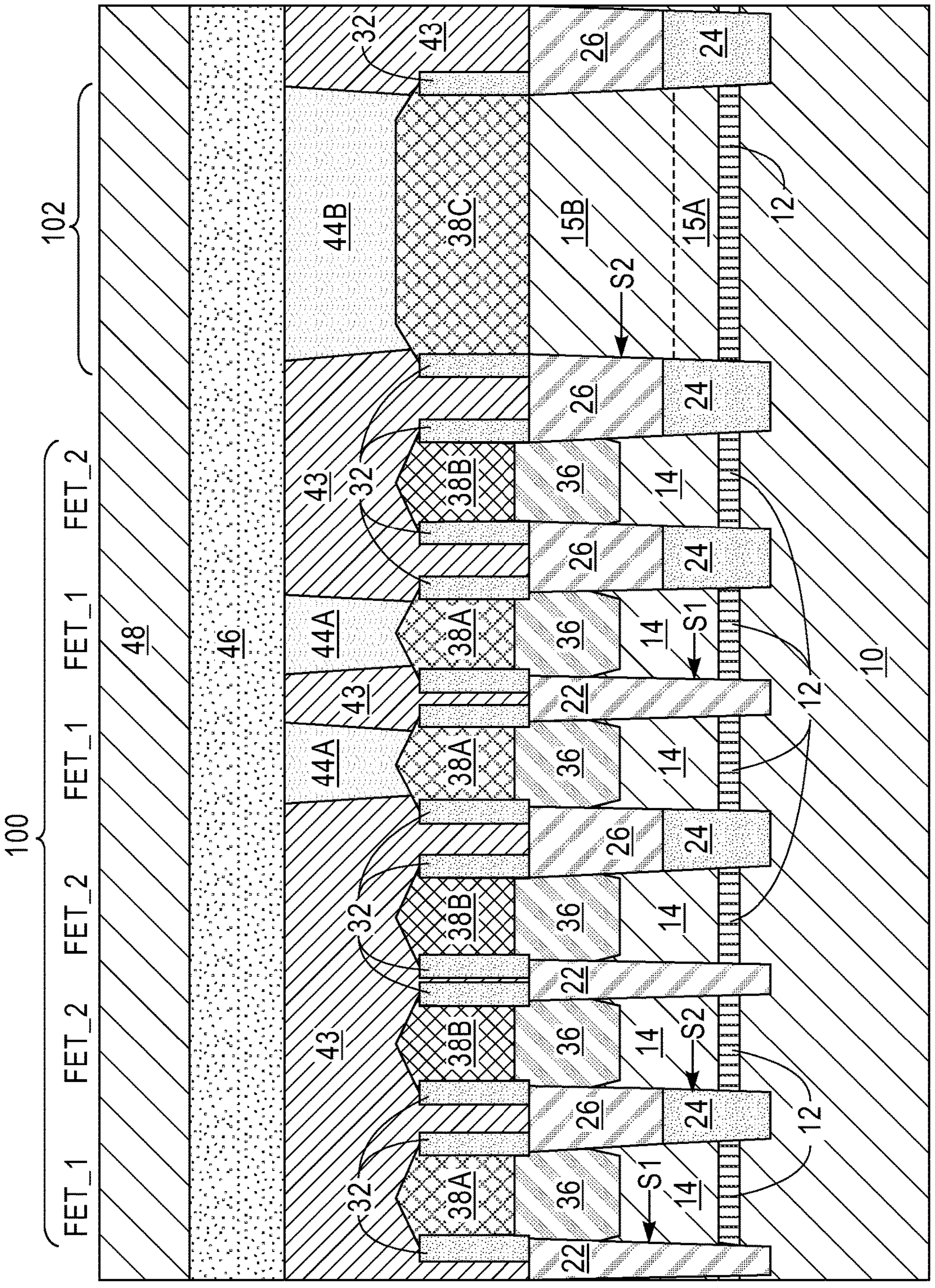

Referring now to FIGS. 9A and 9B, there are illustrated the exemplary semiconductor structure shown in FIGS. 8A and 8B, respectively, after forming a second frontside ILD layer, frontside contact structures 44A, 44B, a frontside BEOL structure 46 and a carrier wafer 48. The second frontside ILD layer typically, but not necessarily always, is composed of a compositionally same dielectric material as that employed in providing the first frontside ILD layer 40. Collectively, the second frontside ILD layer and the first frontside ILD layer 40 provide a frontside middle-of-the-line (MOL) dielectric layer 43 that will house the frontside contact structures 44A, 44B. The second frontside ILD layer can be formed utilizing a deposition process used to provide the first frontside ILD layer 40.

The frontside contact structures 44A, 44B are then formed utilizing a metallization process that includes forming frontside contact openings in the MOL dielectric layer 43, and thereafter filling (including deposition and planarization) each frontside contact opening with at least a contact conductor material. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside source/drain contact structures 46 can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

In the present application, frontside contact structures 44A is a frontside source/drain contact structure that electrically connects one of the source/drain regions 38A of at least one of the first conductivity type FET, FET_1, to the frontside BEOL structure 46, or one of the source/drain regions 38B of at least one of the second conductivity type FET, FET_2, to the frontside BEOL structure 46. In the illustrated embodiments, source/drain regions 38A of first conductivity type FETs, FET_1, are electrically connected to the frontside BEOL structure 46 by frontside contact structures 44A. In the present application, frontside contact structure 44B is a frontside source/drain contact structure that electrically connects one of the source/drain regions 38C of the passive device to the frontside BEOL structure 46. Each frontside contact structure 44A, 44B has a topmost surface that is coplanar with a topmost surface of the MOL dielectric layer 43. The frontside contact structures 44A, 44B and MOL dielectric layer 43 represent a MOL structure.

The frontside BEOL structure 46 is then formed on the MOL dielectric layer 43. The frontside BEOL structure 46 can include one or more interconnect dielectric material layers (including one of the dielectric materials mentioned above for the first frontside ILD layer 40) that contain frontside metal wires (the metal wires can be composed of any electrically conductive metal or electrically conductive metal alloy) embedded therein. The frontside BEOL structure 76 can include "x" numbers of frontside metal levels, wherein "x" is an integer starting from 1. The frontside BEOL structure 46 can be formed utilizing techniques well known to those skilled in the art.

The carrier wafer 48 can include one of the semiconductor materials mentioned above for the first semiconductor layer 10. Carrier wafer 48 is bonded to the frontside BEOL structure 46 after formation of the frontside BEOL structure 46.

Figure 10A:
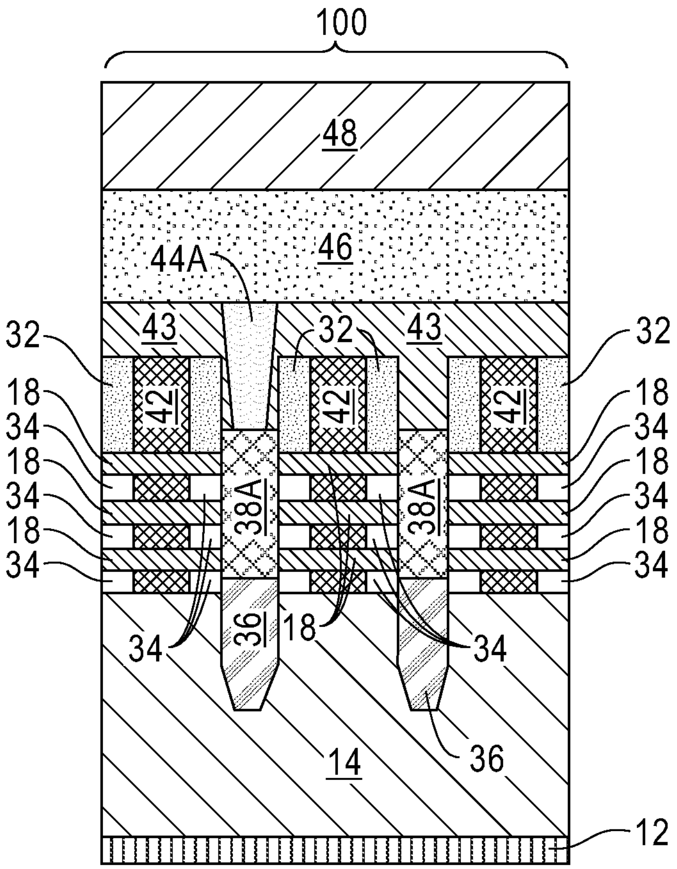
FIGS. 10A and 10B are cross sectional views of the exemplary semiconductor structure shown in FIGS. 9A and 9B, respectively, after removing a first semiconductor layer of the substrate to expose an etch stop layer of the substrate.
Figure 10B:
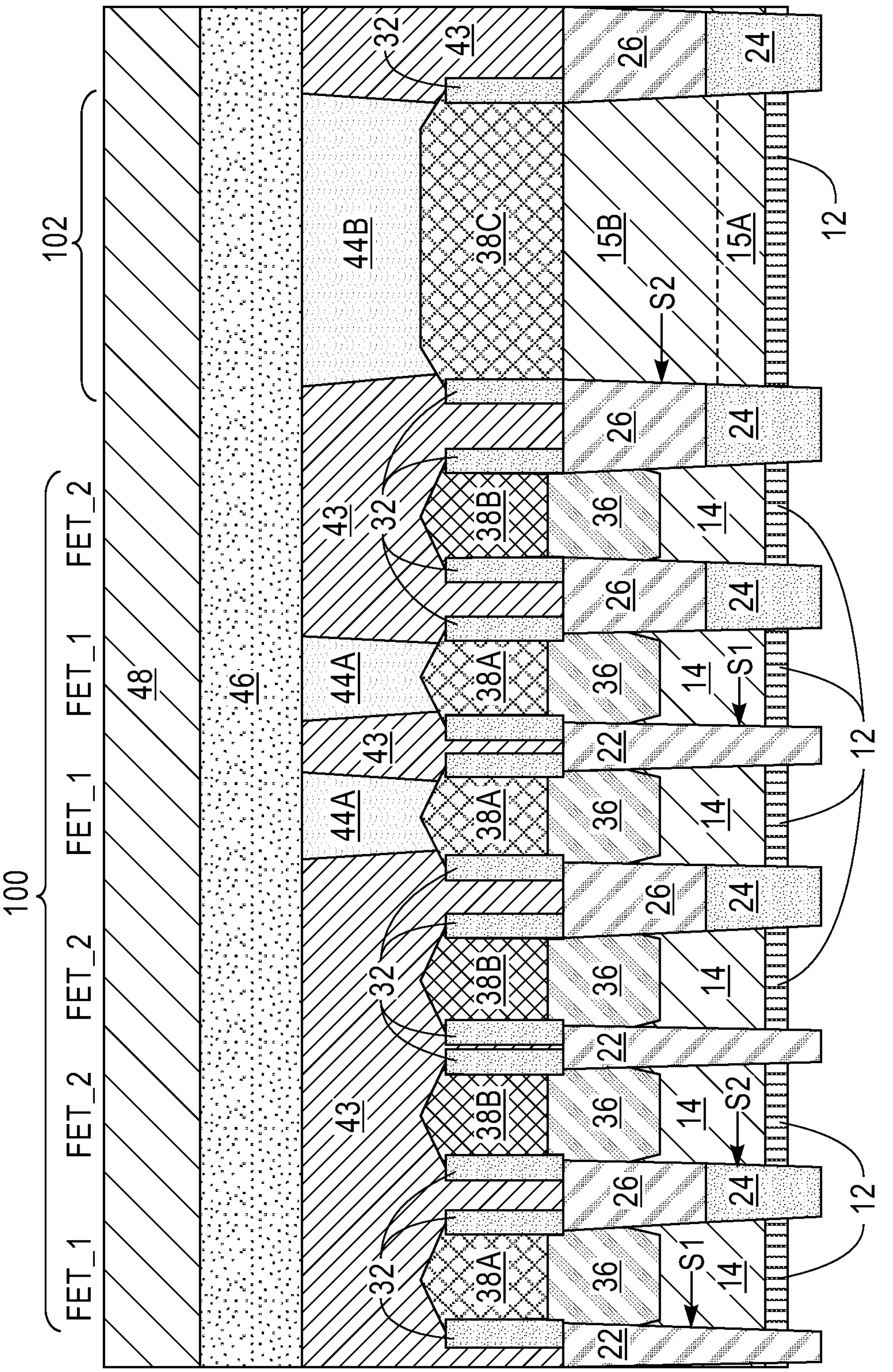

Referring now to FIGS. 10A and 10B, there are illustrated the exemplary semiconductor structure shown in FIGS. 9A and 9B, respectively, after removing the first semiconductor layer 10 of the substrate to expose the etch stop layer 12 of the substrate. The removal of the first semiconductor layer 10 typically includes flipping the wafer 180° to physically expose a backside of the substate. This flipping step is not shown in the drawings of the present application for clarity. This flipping step will allow backside processing of the exemplary structure. In the present application, the backside of the wafer can be defined as the area of the wafer that is beneath each of the gate structures 42. Flipping of the structure can be performed by hand or by utilizing a mechanical means such as, for example, a robot arm. In the illustrated embodiment, the removal of the physically exposed first semiconductor layer 10 physically exposes the etch stop layer 12. The removal of the first semiconductor layer 10 can be performed utilizing a material removal process that is selective in removing the first semiconductor material that provides the first semiconductor layer 10.

Figure 11A:
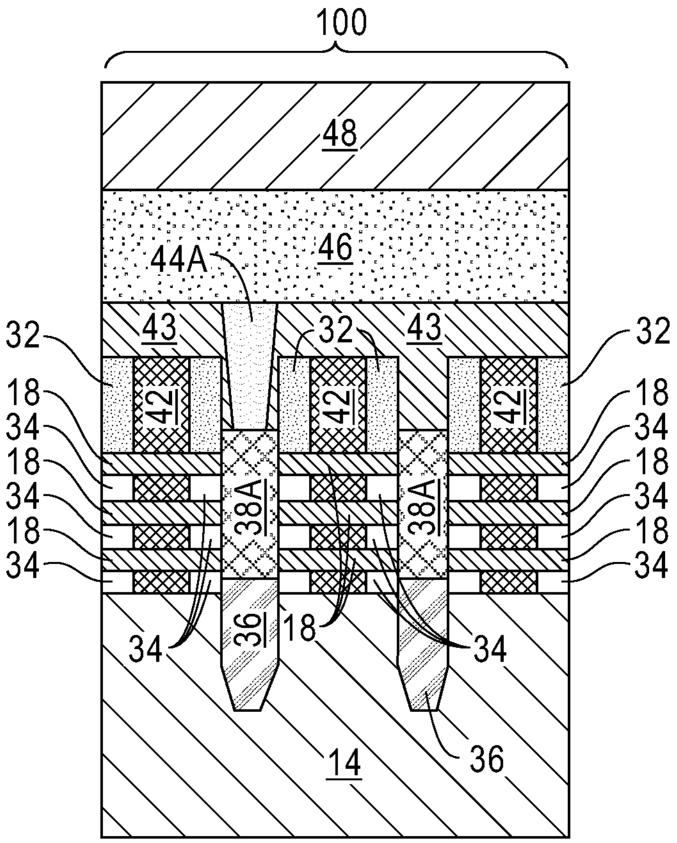
FIGS. 11A and 11B are cross sectional views of the exemplary semiconductor structure shown in FIGS. 10A and 10B, respectively, after forming an organic planarization layer (OPL) on the etch stop layer in the passive device region of the structure, and removing the etch stop layer from the logic device region.
Figure 11B:
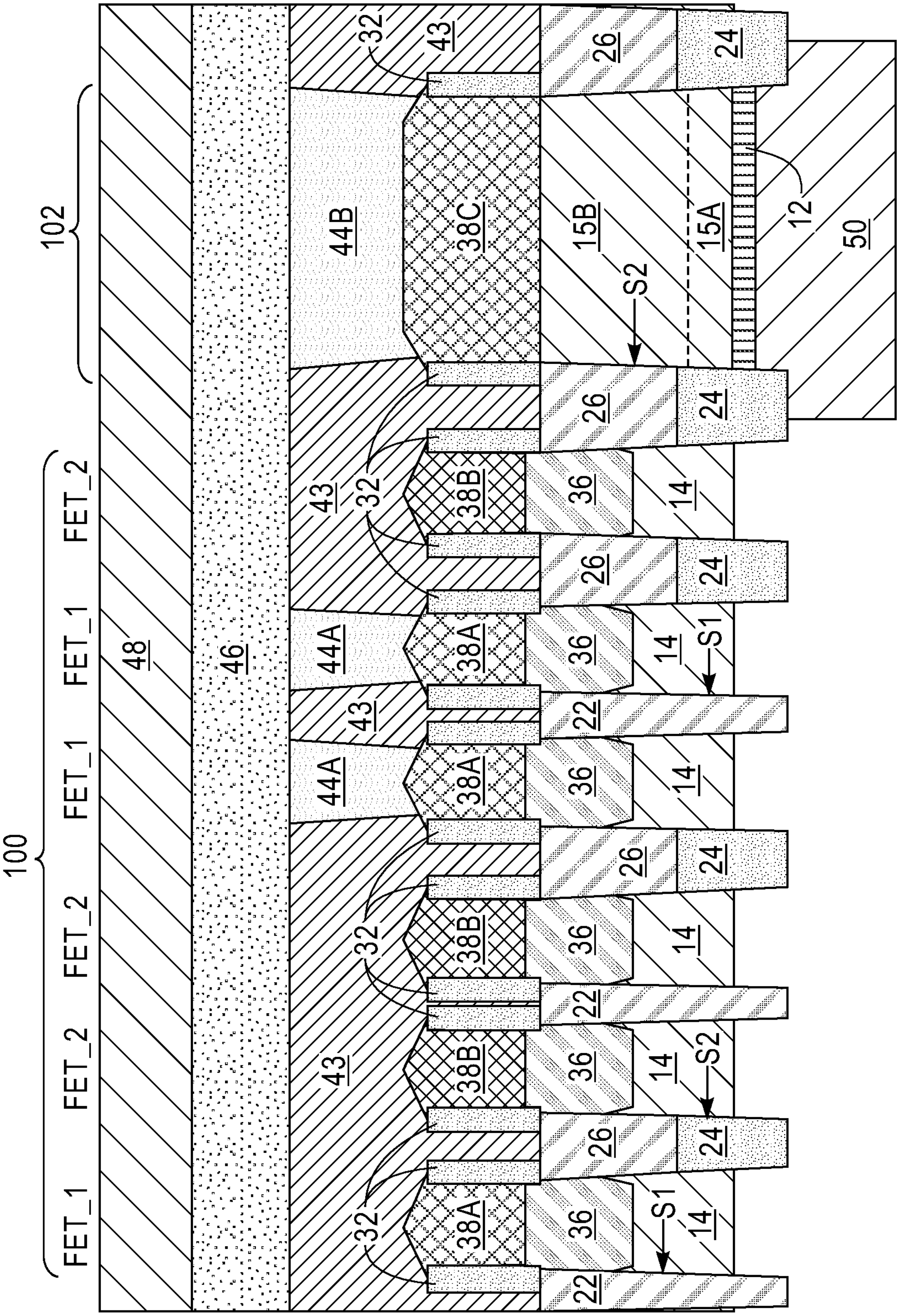

Referring now to FIGS. 11A and 11B, there are illustrated the exemplary semiconductor structure shown in FIGS. 10A and 10B, respectively, after forming an OPL 50 on the etch stop layer 12 in the passive device region 102 of the structure, and then removing the etch stop layer 12 from the logic device region 100. The OPL 50 can be formed by deposition, followed by lithographic patterning. The OPL 50 protects the passive device region 102 such that no undercutting is performed in the passive device region 102 during the removal of the etch stop layer 12 of the substrate from the logic device region 100.

The removal of the etch stop layer 12 from the logic device region 100 includes a material removal process that is selective in removing the etch stop layer 12. The removal of the etch stop layer 12 physically exposes the second semiconductor layer 14 of the substrate in the logic device region 100. Passive device region 102 is protected by OPL 50 during this processing step of the present application.

Figure 12A:
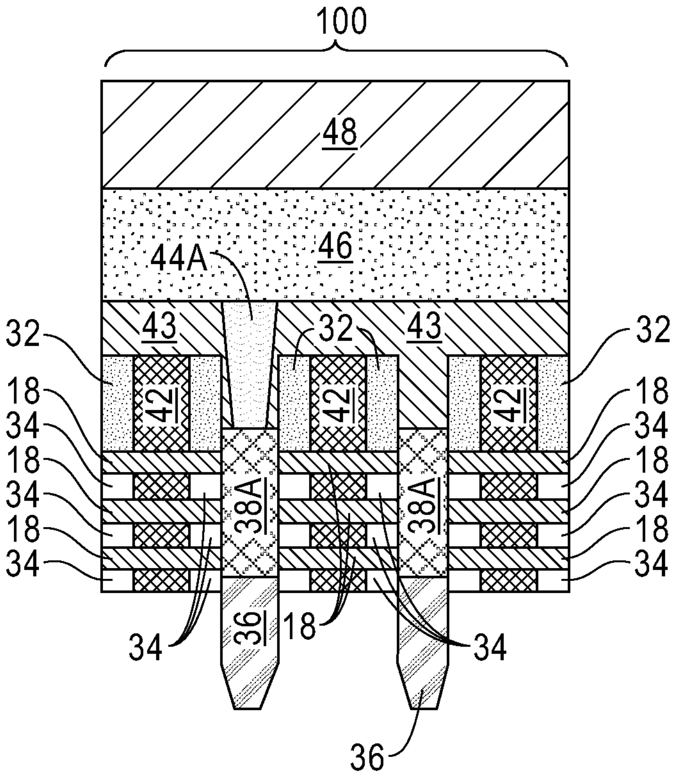
FIGS. 12A and 12B are cross sectional views of the exemplary semiconductor structure shown in FIGS. 11A and 11B, respectively, after removing the OPL from the passive device region, and thereafter removing a second semiconductor layer of the substrate from the logic device region.
Figure 12B:
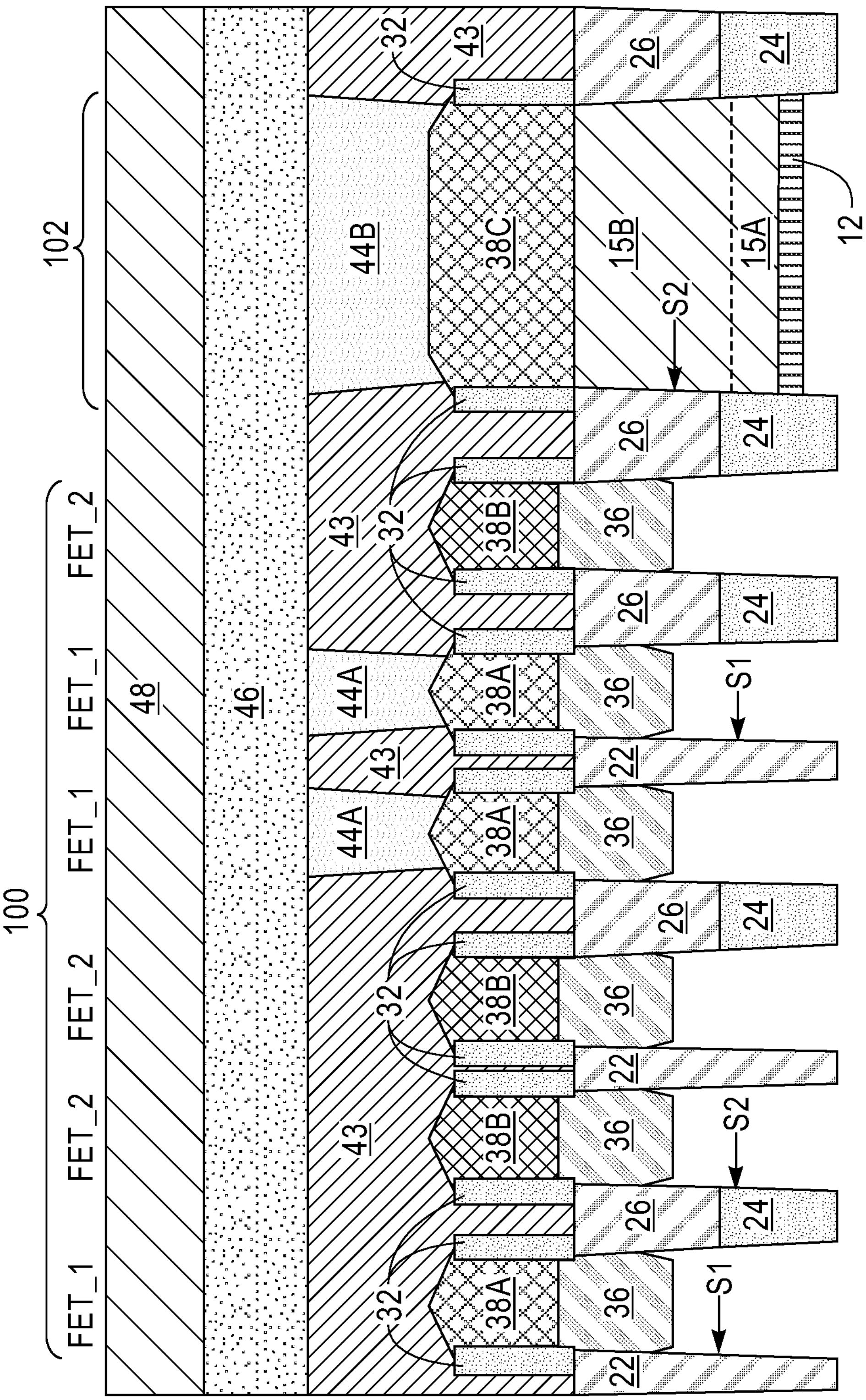

Referring now to FIGS. 12A and 12B, there are illustrated the exemplary semiconductor structure shown in FIGS. 11A and 11B, respectively, after removing the OPL 50 from the passive device region 102, and thereafter removing the second semiconductor layer 14 of the substrate from the logic device region 100. The OPL 50 can be removed utilizing any material removal process that is selective in removing the OPL 50 from the structure. The removal of the OPL 50 from the passive device region 102 physically exposes the etch stop layer 12 that remains in the passive device region 102. The etch stop layer 12 that remains in the passive device region 102 protects the doped region 15A from being removed during the removal of the second semiconductor layer 14 from the logic device region 100.

The physically exposed second semiconductor material layer 14 that is contained within the logic device region 100 can be removed utilizing a material removal process that is selective in removing that layer from the structure. As is illustrated in FIGS. 12 and 12B, the removal of the substrate (10/12/14) in the logic device reveals a surface of each backside contact placeholder structures 36.

Figure 13A:
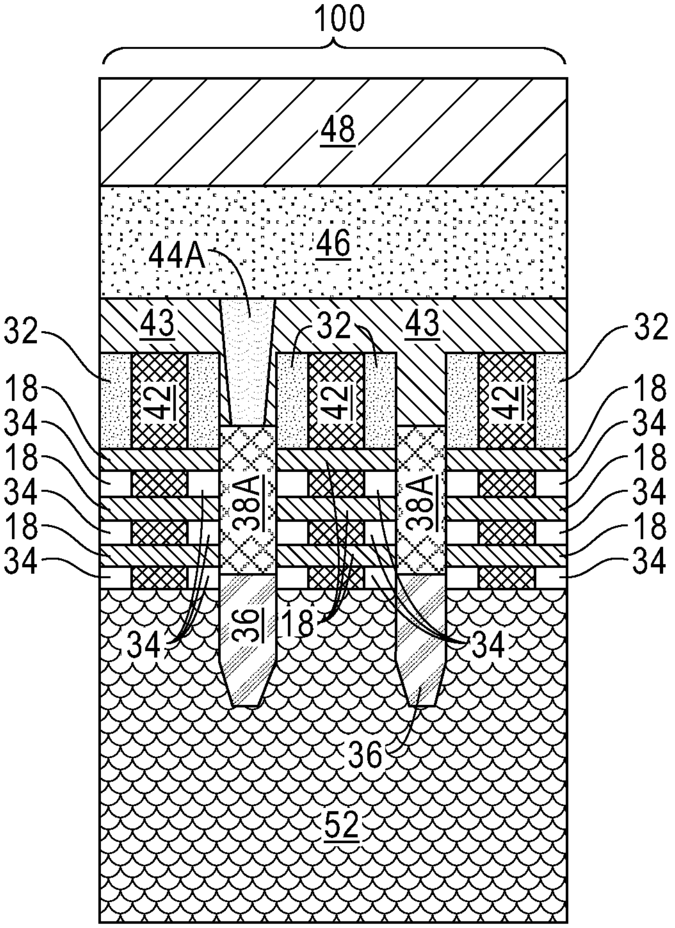
FIGS. 13A and 13B are cross sectional views of the exemplary semiconductor structure shown in FIGS. 12A and 12B, respectively, after forming a first backside ILD layer.
Figure 13B:
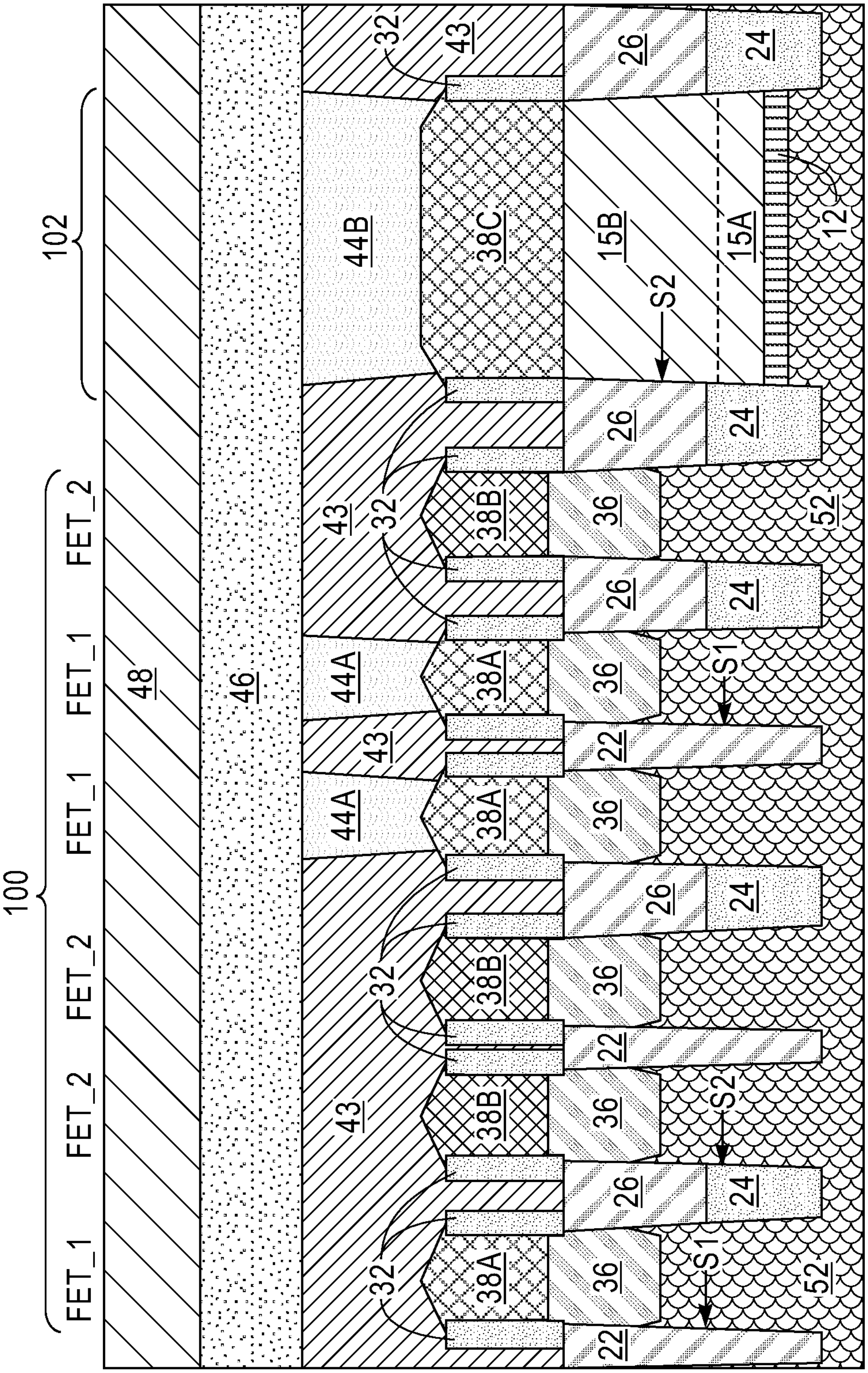

Referring now to FIGS. 13A and 13B, there are illustrated the exemplary semiconductor structure shown in FIGS. 12A and 12B, respectively, after forming a first backside ILD layer 52. The first backside ILD layer 52 can include one of the dielectric materials mentioned above for the first frontside ILD layer 40. The first backside ILD layer 52 can be formed utilizing a deposition process as described above for forming the first frontside ILD layer 40.

Figure 14A:
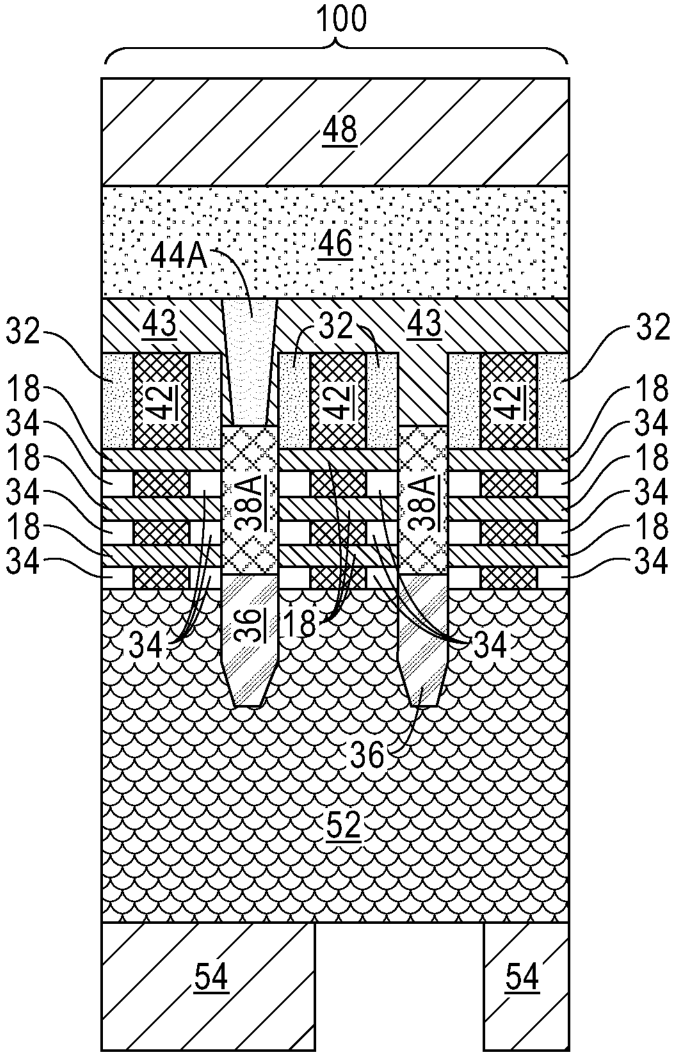
FIGS. 14A and 14B are cross sectional views of the exemplary semiconductor structure shown in FIGS. 13A and 13B, respectively, after forming a patterned backside OPL on the first backside ILD layer.
Figure 14B:
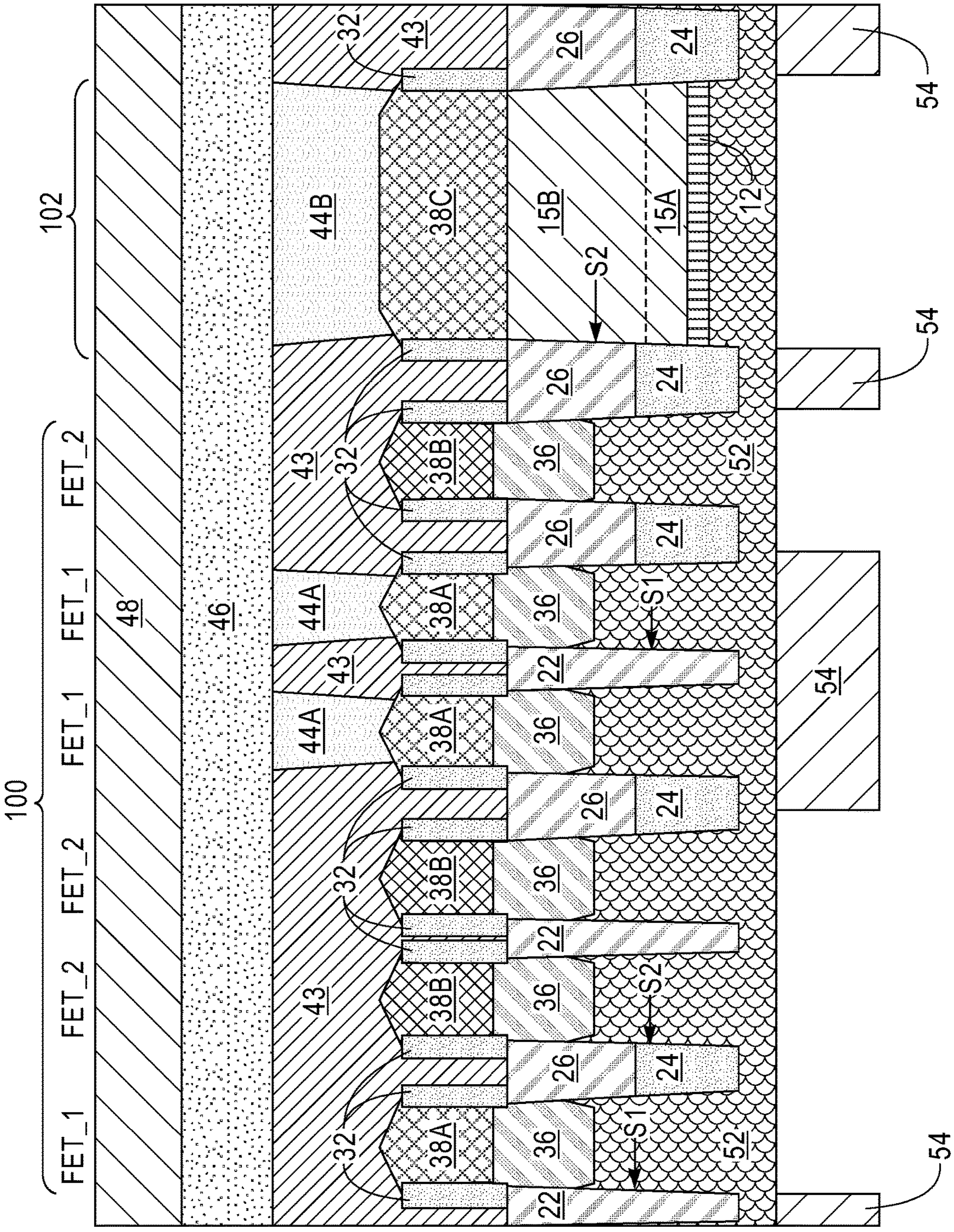

Referring now to FIGS. 14A and 14B, there are illustrated the exemplary semiconductor structure shown in FIGS. 13A and 13B, respectively, after forming a patterned backside OPL 54 on the first backside ILD layer 52. The patterned backside OPL 54 is formed by deposition, followed by lithographic patterning. The patterned backside OPL 54 includes a backside contact pattern that will be subsequently transferred into the first backside ILD layer 52.

Figure 15A:
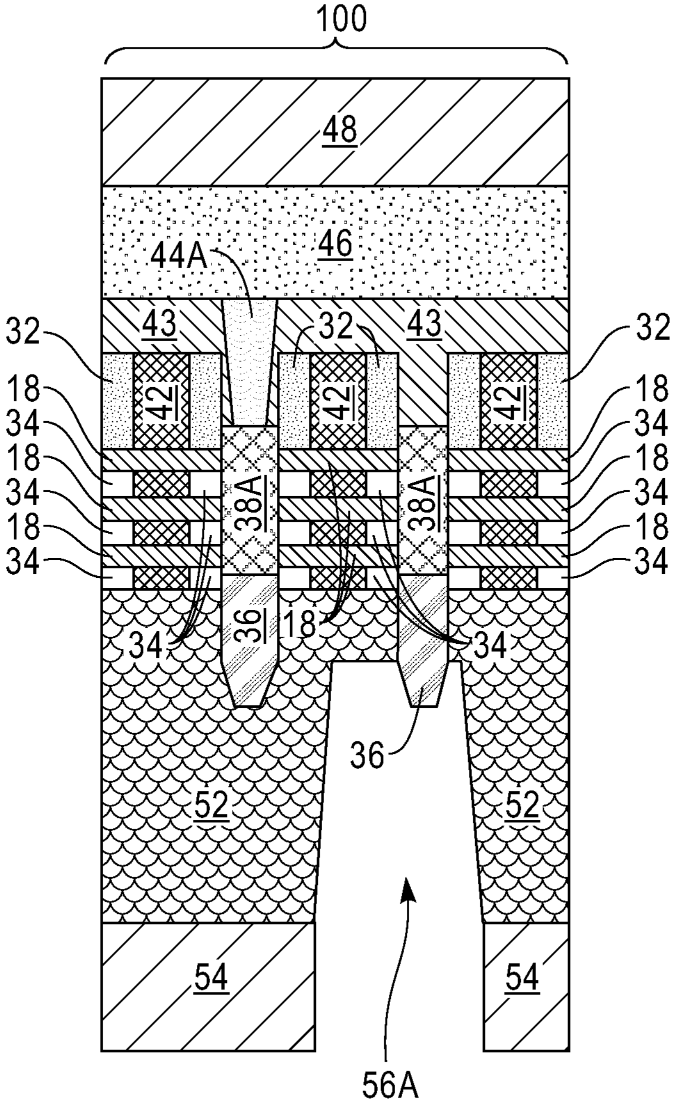
FIGS. 15A and 15B are cross sectional views of the exemplary semiconductor structure shown in FIGS. 14A and 14B, respectively, after forming backside contact openings in the first backside ILD layer utilizing the patterned backside OPL as an etch mask, wherein the backside contact openings in the logic device region physically expose some of the backside contact placeholder structures, and the backside contact opening in the passive device region physically exposes a doped region that is located beneath a well region.
Figure 15B:
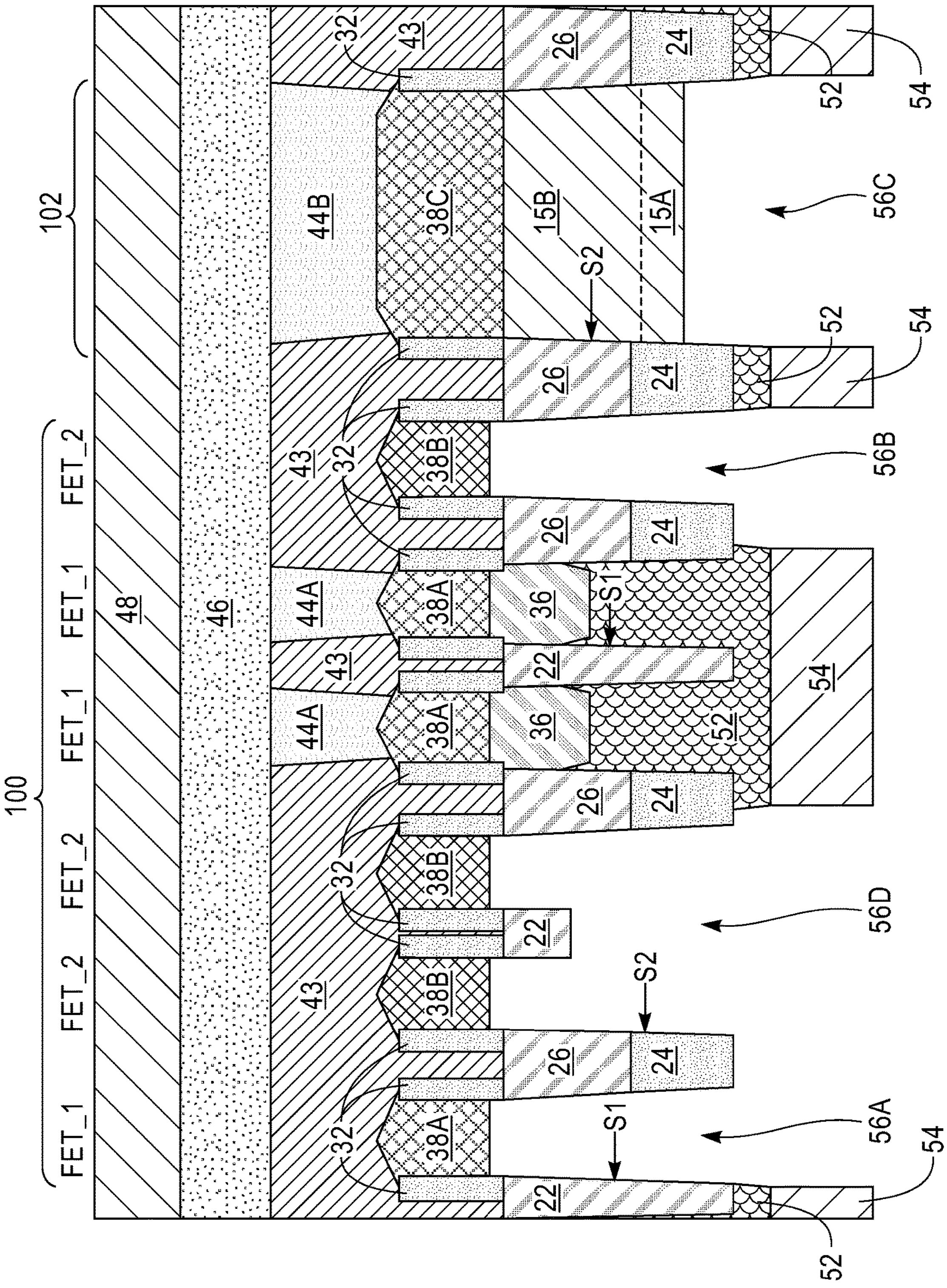

Referring now to FIGS. 15A and 15B, there are illustrated the exemplary semiconductor structure shown in FIGS. 14A and 14B, respectively, after forming backside contact openings 56A, 56B, 56C and 56D in the first backside ILD layer 52 utilizing the patterned backside OPL 54 as an etch mask, and the etching process selectively etches the first backside ILD layer 52 and the first trench dielectric material 22 with respect to the second trench dielectric material 24 such that a merged contact opening is formed for devices with the same polarity, and self-isolation is formed between contacts to devices with different polarities, wherein the backside contact openings 52A, 52B and 52D in the logic device region 100 physically expose some of the backside contact placeholder structures 36 and the backside contact opening 56C in the passive device region 102 physically exposes doped region 15A that is located beneath well region 15B. Notably, each backside contact opening 52A physically exposes the backside contact placeholder structure 36 that is located beneath the source/drain region 38A of the individual first conductivity type FET, FET_1. Each backside contact opening 52B physically exposes the backside contact placeholder structure 36 that is located beneath the source/drain region 38A of the individual second conductivity type FET, FET_2. Backside contact opening 56C physically exposes the doped region 15A in the passive device region 102. Backside contact opening 56D is present beneath two neighboring conductivity type FETs. In the illustrated embodiment, and by way of one example, the backside contact opening 56D is present beneath two neighboring second conductivity type FETs, FET_2. In such an embodiment, no backside contact opening is formed beneath two neighboring first conductivity type FETs, FET_1.

In the present application, this step can form merged backside contact openings between two neighboring FETs of the same conductivity type, while forming an isolated backside contact opening between each neighboring pair of first conductivity type FET, FET_1 and second conductivity type FET, FET_2. The backside contact openings 56A, 56B, 56C and 56D are formed by etching utilizing the patterned backside OPL 54 as an etch mask. In the passive device region 102, another etch can be used to remove the etch stop layer 12 from that region of the structure.

Figure 16A:
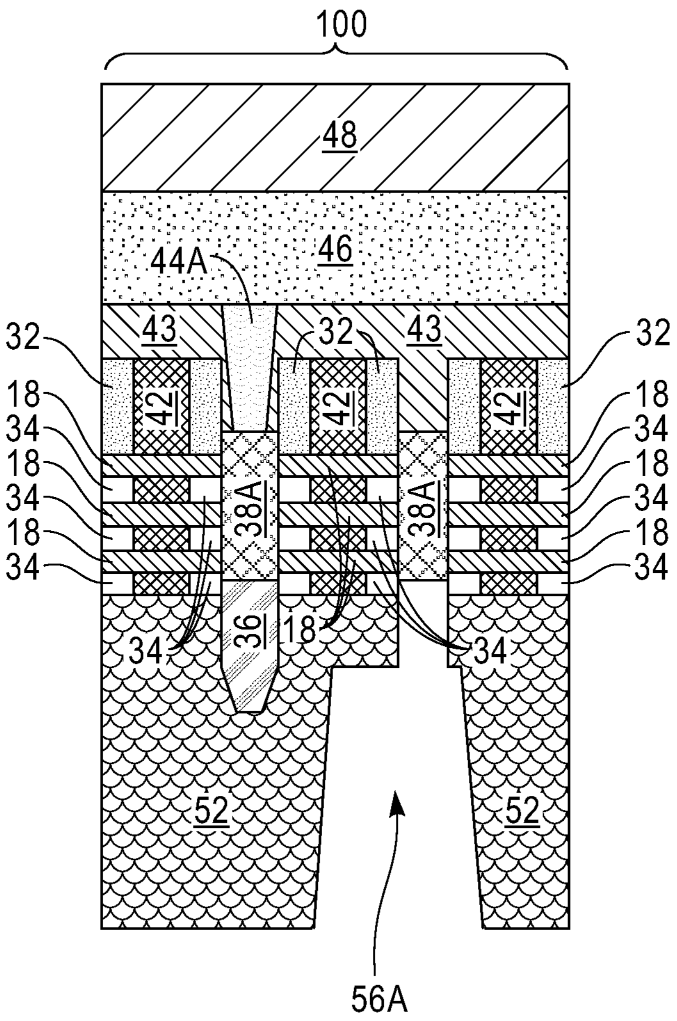
FIGS. 16A and 16B are cross sectional views of the exemplary semiconductor structure shown in FIGS. 15A and 15B, respectively, after removing the physically exposed backside contact placeholder structures to reveal some of the source/drain regions.
Figure 16B:
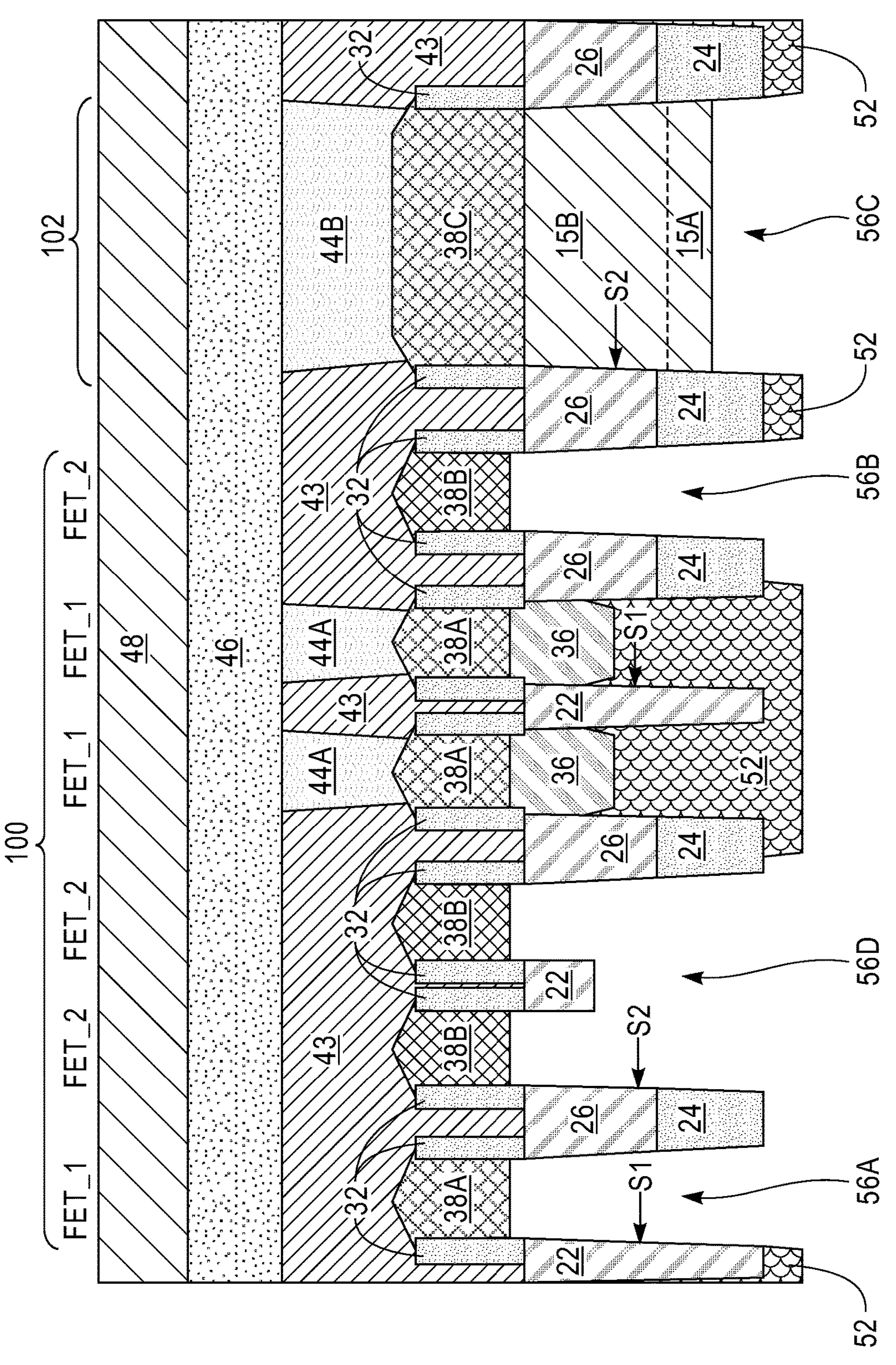

Referring now to FIGS. 16A and 16B, there are illustrated the exemplary semiconductor structure shown in FIGS. 15A and 15B, respectively, after removing the physically exposed backside contact placeholder structures 36 to reveal some of the source/drain regions. In the illustrated embodiment, the first source/drain region 38A of the individual first conductivity type FET, FET_1, the second source/drain region 38B of the individual second conductivity type FET. FET_2, and both second source/drain regions 38B of the two neighboring second conductivity type FETs, FET_2, are physically exposed. The physically exposed backside contact placeholder structures 36 can be removed utilizing an etching process that is selective in removing the dielectric material that provides the backside contact placeholder structures 36.

Figure 17A:
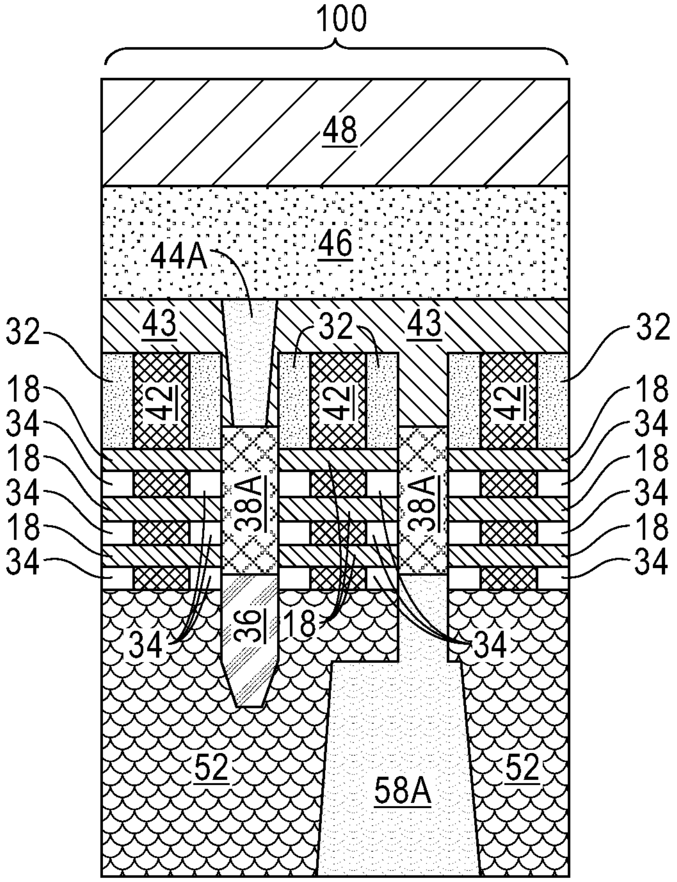
FIGS. 17A and 17B are cross sectional views of the exemplary semiconductor structure shown in FIGS. 16A and 16B, respectively, after forming backside contact structures in each backside contact opening.
Figure 17B:
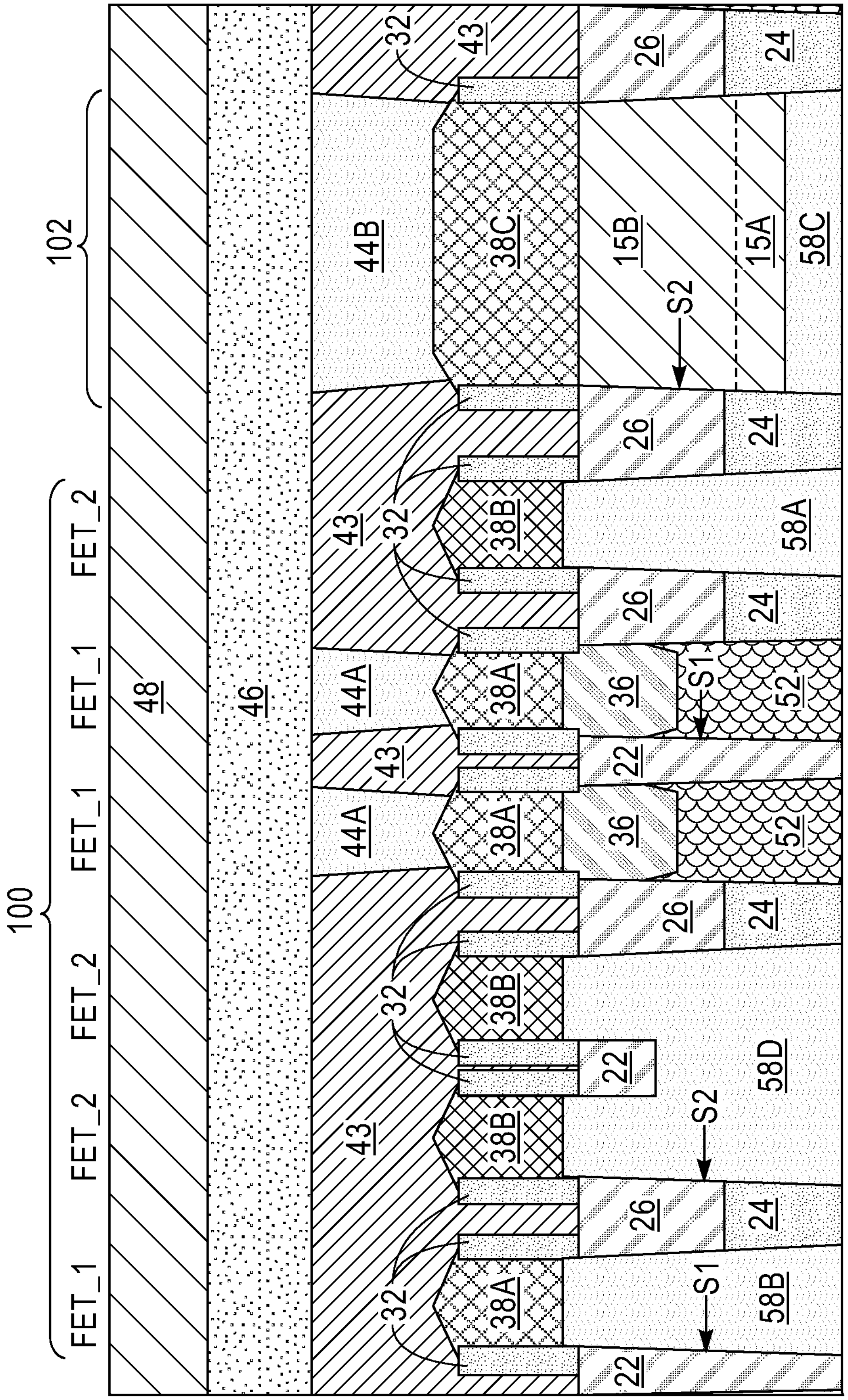

Referring now to FIGS. 17A and 17B, there are illustrated the exemplary semiconductor structure shown in FIGS. 16A and 16B, respectively, after forming backside contact structures 58A, 58B, 58C and 58D in each backside contact opening 56A, 56B, 56C and 56D. Backside contact structures 58A, 58B, 58C and 58D are formed by filling (including deposition and planarization) each backside contact opening 56A, 56B, 56C and 56D with at least a contact conductor material. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside source/drain contact structures 46 can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

In the present application, each backside contact structure 58A is a backside source/drain contact structure that contacts one of the source/drain regions 38A of an individual first conductivity type FET, FET_1, each backside contact structure 58B is a backside source/drain contact structure that contacts one of the source/drain regions 38B of an individual second conductivity type FET, FET_2, and backside contact structure 58C is a backside contact structure that contacts the doped region 15A of the passive device. In the present application, backside contact structure 58D is a merged backside source/drain contact structure that contacts source/drain regions of two neighboring FETs of the same conductivity. In one embodiment, and as is illustrated in FIG. 17B, backside contact structure 58D is a merged backside source/drain contact structure that contacts source/drain regions 38B of two neighboring second conductivity type FETs. In a non-illustrated embodiment, backside contact structure 58D is a merged backside source/drain contact structure that contacts source/drain regions 38A of two neighboring first conductivity type FETs.

Referring now to FIGS. 18A and 18B, there are illustrated the exemplary semiconductor structure shown in FIGS. 17A and 17B, respectively, after forming an initial backside BEOL structure and an additional backside BEOL structure 62. The initial backside structure (which represent a lower backside interconnect level) includes VSS power rails. VSS, and VDD power rails, VDD, embedded in a second backside ILD layer 60. The second backside ILD layer 60 includes one of the dielectric materials mentioned above for the first frontside ILD layer 40. The dielectric material that provides the second backside ILD layer 60 can be compositionally the same as, or compositionally different from, the dielectric material that provides the first backside ILD layer 52.

The VSS power rails, VSS, and VDD power rails, VDD, are composed of any electrically conductive power rail material including, but not limited to, tungsten (W), cobalt (Co), ruthenium (Ru), aluminum (Al), copper (Cu), platinum (Pt), rhodium (Rh), or palladium (Pd). A diffusion barrier, not shown, can be present on at least the sidewalls of The VSS power rails, VSS, and VDD power rails, VDD. The VSS power rails, VSS, and VDD power rails, VDD can be formed utilizing a damascene process in which openings are formed in the second backside ILD layer 60 and those openings are then filled with at least one of the electrically conductive power rail materials mentioned above. The filling of the openings can include a deposition process such as, for example, CVD, PECVD. ALD, sputtering or plating. A planarization process can follow the deposition process. In other embodiments, a substrative etching process can be used in which the VSS power rails. VSS, and VDD power rails, VDD are first formed by deposition of a layer of an electrically conductive power rail material, followed by patterning the deposited layer of electrically conductive power rail material into the VSS power rails, VSS, and VDD power rails, VDD. The second backside ILD layer 60 can then be formed to embed the VSS power rails, VSS, and VDD power rails, VDD, Additional backside BEOL structure 62 is then formed on the initial BEOL structure. The additional backside BEOL structure 62 can include one or more interconnect dielectric material layers (including one of the dielectric materials mentioned above for the first frontside ILD layer 40) that contain frontside metal wires (the metal wires can be composed of any electrically conductive metal or electrically conductive metal alloy) embedded therein. The additional backside BEOL structure 62 can include "y" numbers of backside metal levels, wherein "y" is an integer starting from 1. The additional backside BEOL structure 62 can be formed utilizing techniques well known to those skilled in the art. The additional backside BEOL structure 62 can be used as a backside power distribution network.

In the present application, the additional BEOL structure 62 is wired to the source/drain region of at least one of the conductivity type FETs via a VSS power rail, VSS, or a VDD power rail, VDD, and one of backside contact structure. The additional BEOL structure 62 is also wired to the doped region 15A of the passive device via backside contact structure 58C and one of the a VSS power rails, VSS. Overlap between the backside contact structures 58A, 58B, 58C and 5D is not an issue despite having tight spacing between the various FETs in the logic device region 100, and between the logic device region 100 and the passive device region 102.

In the illustrated embodiment, the additional BEOL structure 62 is wired to the source/drain region 38A of an individual first conductivity type FET, FET_1, by a VSS power rail and backside contact structure 58B. The additional BEOL structure 62 is also wired to the source/drain region 38B of an individual first conductivity type FET, FET_1, by a VDD power rail and backside contact structure 58A. The additional BEOL structure 62 is further wired to the source/drain regions 38B of two neighboring FETs of the same conductivity type, e.g., second conductivity type FETs_FET_2, by the merged backside contact structure 58D. In a space above the merged backside contact structure 58D, a first trench dielectric material 22 is present that has a reduced height as compared to the other regions including the first trench dielectric material 22.

In the semiconductor structure shown in FIG. 18B, the first trench isolation structure, S1, shown in region A1 (i.e., a region between two neighboring FETs of the same conductivity type, e.g., two second conductivity type FETs, FET_2, that have their source/drain regions merged by the merged contact merged backside source/drain contact structure (i.e., backside contact structure 58D)) has a depth that is less than other first trench isolation structures, S1, that are present in the structure, i.e., compare the first trench isolation structure, S1 in region A1 to the first trench isolation structure, S1, in region A2. In the present application, the reduced depth of the first trench isolation structure in region A1 is less than a depth of any remaining backside contact placeholder structures 36.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a logic device region comprising a plurality of first conductivity type field effect transistors (FETs) and a plurality of second conductivity type FETs, wherein the first conductivity type FETs are spaced apart from the second conductivity type FETs and the first conductivity type FETs are of a different conductivity than the second conductivity type FETs;

a first trench isolation structure located in a space between each neighboring pair of first conductivity type FETs and between each neighboring pair of second conductivity type FETs, wherein the first trench isolation structure comprises a first trench dielectric material as a sole trench dielectric material;

a second trench isolation structure located in a space between each neighboring pair of first conductivity type FETs and second conductivity type FETs, wherein the second trench isolation structure comprises at least a second trench dielectric material that is compositionally different from the first trench dielectric material, wherein a bottommost surface of the first trench isolation structure is in a same horizontal plane as a bottommost surface of the second trench isolation structure; and a first backside interlayer dielectric layer and a second backside interlayer dielectric layer located beneath the first conductivity type FETs and the second conductivity type FETs, wherein both the first trench isolation structure and the second trench isolation structure extends through the first backside interlayer dielectric layer and stop on a topmost surface of the second backside interlayer dielectric layer.

2. The semiconductor structure of claim 1, wherein the second trench isolation structure is entirely composed of the second trench dielectric material.

3. The semiconductor structure of claim 1, further comprises a third trench dielectric material located entirely above the second trench dielectric material, wherein the third trench dielectric material is compositionally different from the second trench dielectric material.

4. The semiconductor structure of claim 3, wherein the third trench dielectric material and the first trench dielectric material are composed of a compositionally same trench dielectric material.

5. The semiconductor structure of claim 3, wherein the third trench dielectric material is compositionally different from the first trench dielectric material.

6. The semiconductor structure of claim 1, wherein the first trench isolation structure has a first width and the second trench isolation structure has a second width, wherein the first width is greater than the second width.

7. The semiconductor structure of claim 1, further comprising a merged backside source/drain contact structure contacting source/drain regions of at least one neighboring pair of first conductivity type FETs or source/drain regions of at least one neighboring pair of second conductivity type FETs.

8. The semiconductor structure of claim 7, further comprising an additional backside back-end-of-the-line (BEOL) structure electrically contacted to the merged backside source/drain contact structure via a VDD power rail located in an initial backside BEOL structure.

9. The semiconductor structure of claim 7, wherein the first trench isolation structure located in the space between the at least one neighboring pair of first conductivity type FETs or the at least one neighboring pair of second conductivity type FETs including the merged backside source/drain contact structure has a depth that is less than a depth of the second trench isolation structure.

10. The semiconductor structure of claim 9, further comprising a frontside contact structure contacting a source/drain region of the first conductivity type FETs not including the merged backside source/drain contact structure or a source/drain region of the second conductivity type FETs not including the merged backside source/drain contact structure.

11. The semiconductor structure of claim 10, further comprising a frontside BEOL structure contacting the frontside contact structure.

12. The semiconductor structure of claim 10, further comprising a backside placeholder structure located beneath the source/drain region that contacts the frontside contact structure.

13. The semiconductor structure of claim 1, further comprising:

a passive device region comprising at least one electrostatic discharge protection diode located adjacent to the logic device region, and a passive device region-logic device region second trench isolation structure located in a space between the logic device region and the passive device region, wherein the passive device region-logic device region second trench isolation structure comprises at least the second trench dielectric material; and a frontside contact structure contacting a first surface of the at least one electrostatic discharge protection diode, and a backside contact structure contacting a second surface of the at least one electrostatic discharge protection diode, wherein the second surface is opposite the first surface.

14. The semiconductor structure of claim 13, wherein the passive device region-logic device region second trench isolation structure is entirely composed of the second trench dielectric material.

15. The semiconductor structure of claim 13, wherein the passive device region-logic device region second trench isolation structure further comprises a third trench dielectric material located entirely above the second trench dielectric material, wherein the third trench dielectric material is compositionally different from the second trench dielectric material.

16. The semiconductor structure of claim 15, wherein the third trench dielectric material and the first trench dielectric material are composed of a compositionally same trench dielectric material.

17. The semiconductor structure of claim 15, wherein the third trench dielectric material is compositionally different from the first trench dielectric material.

18. The semiconductor structure of claim 13, wherein the frontside contact structure electrically connects the at least one electrostatic discharge protection diode to a frontside BEOL structure, and the backside contact structure electrically connects the at least one electrostatic discharge protection diode to an additional backside BEOL structure via a VSS power rail that is present in an initial backside BEOL structure.

* * * * *